United States Patent
Takeuchi

(10) Patent No.: US 6,734,481 B2
(45) Date of Patent: May 11, 2004

(54) SEMICONDUCTOR DEVICE HAVING A MONITOR PATTERN

(75) Inventor: Masahiko Takeuchi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 11 days.

(21) Appl. No.: 10/122,314

(22) Filed: Apr. 16, 2002

(65) Prior Publication Data

US 2003/0001179 A1 Jan. 2, 2003

(30) Foreign Application Priority Data

Jun. 29, 2001 (JP) ........................ 2001-198555

(51) Int. Cl.[7] ................ H01L 27/108; H01L 23/58
(52) U.S. Cl. .............. 257/296; 257/298; 257/300; 257/303; 257/48; 257/304
(58) Field of Search .................... 257/296, 298, 257/300, 303, 306, 308, 304, 48, 344, 309, 321, 428, 429

(56) References Cited

U.S. PATENT DOCUMENTS 6,372,525 B1 * 4/2002 Lin et al. .................. 438/14

FOREIGN PATENT DOCUMENTS

JP        2000-332104        11/2000

* cited by examiner

Primary Examiner—Minhloan Tran
Assistant Examiner—Tan Tran
(74) Attorney, Agent, or Firm—McDermott, Will & Emery

(57) ABSTRACT

Lead interconnection layers and are electrically connected to the respective source and drain regions of a pair of a monitor transistor MT. Lead interconnection layers and are both formed on same insulating layer and on same insulating layer as is a bit line conductive layer of a memory cell area. Furthermore, lead interconnection layers and have respective contact sections each with a large width and to each of which a needle of a probe can be connected externally. With such a structure adopted, there can be obtained a semiconductor device capable of monitoring a transistor characteristic correctly and easily by reducing parasitic resistance, further, at an early stage in a wafer process; and a fabrication process therefor.

5 Claims, 51 Drawing Sheets

SEMICONDUCTOR DEVICE HAVING A MONITOR PATTERN

BACKGROUND OF THE INVENTION

1. Field of the Invention

The present invention relates to a semiconductor device and a fabrication process therefor, and more particularly, to a semiconductor device having a monitor pattern for measuring a characteristic of a transistor for a memory cell included in the memory cell of a DRAM (Dynamic Random Access Memory) and to a fabrication process therefor.

2. Description of the Background Art

First of all, description will be given of a semiconductor device having a prior art monitor pattern.

FIG. 48 is a plan view showing a configuration of a semiconductor device having a prior art monitor pattern. FIGS. 49, 50, 51 and 52 are schematic sectional views taken on respective lines IL—IL, L—L, LI—LI and LII—LII of FIG. 48.

Referring mainly to FIG. 48, in a monitor area, similar to a memory cell area, there are arranged plural conductive layers 105 corresponding to word lines and plural conductive layers 111 and 111a corresponding to bit lines such that any one of the former and any one of the latter intersect orthogonally with each other. Monitor transistors MT are located in the vicinity of respective corresponding intersections of plural conductive layers 105 and plural conductive layers 111 and 111a. Each of monitor transistors MT has a configuration equivalent to a transistor constituting a memory cell (hereinafter referred to as a memory cell transistor).

Referring to FIGS. 48 to 52, a monitor transistor MT is formed on a surface of a silicon substrate 101 isolated electrically by a trench isolation 102. Monitor transistor MT is a MOS (Metal Oxide Semiconductor) transistor and include a pair of source/drain regions 103, a gate insulating layer 104 and a gate electrode layer 105.

A pair of source/drain regions 103 are formed spaced apart from each other on the surface of silicon substrate 101 and have an LDD (Lightly Doped Drain) structure. Gate electrode layer 105 is formed on a region sandwiched by source/drain regions 103 of the pair with gate insulating layer 104 interposing therebetween. Insulating layers 106 and 107 are formed so as to cover the top and side surfaces of gate electrode layer 105.

An interlayer insulating layer 108 is formed so as to cover plural monitor transistors MT and has holes 108a reaching to source/drain regions 103 formed therein. Holes 108a are each filled with a pad layer 109b or 109c. An interlayer insulating layer 110 is formed on interlayer insulating layer 108 and has a hole 110a reaching pad layer 109b formed therein.

A lead interconnection layer 111a is formed on interlayer insulating layer 110 so as to be electrically connected to pad layer 109b through hole 110a. Furthermore, plural conductive layers 111 are formed on interlayer insulating layer 110 in addition to lead interconnection layer 111a. An interlayer insulating layer 112 is formed so as to cover lead interconnection layer 111a and plural conductive layers 111. Interlayer insulating layer 112 and interlayer insulating layer 110 have a hole 112a reaching pad layer 109c therethrough, and a plug layer 113 is formed in holes 112a.

An interlayer insulating layer 114 is formed on interlayer insulating layer 112 and has a hole 114a formed therein. A lead interconnection layer 115a is formed along an inner wall of hole 114a and electrically connected to pad layer 109c through plug layer 113. Note that a conductive layer 115 serving as many dummy storage nodes is formed in addition to lead interconnection layer 115a. There are formed an insulating layer 116 constituted of the same layer as is a capacitor dielectric layer and a conductive layer 117 constituted of the same layer as is a cell plate so as to cover an upper surface of lead interconnection layer 131, and an insulating layer 118 is formed on conductive layer 117.

In order to monitor a characteristic of monitor transistor MT, source/drain regions 103 of a pair are lead out by respective lead interconnection layers 111a and 115a. Lead interconnection layers 111a and 115a are electrically connected to bonding pad layers, which is the uppermost layer.

In order to monitor a characteristic of a prior art monitor transistor MT, a monitor signal is inputted from a bonding pad exposed on a wafer surface after all the wafer process is over. The monitor signal is given to a pair of source/drain regions 103 of monitor transistor MT from the bonding pad through lead interconnection layer 111a or 115a, and thereby, the characteristic of monitor transistor MT is monitored.

Along with progress in miniaturization of a semiconductor device, especially a DRAM, in structure in recent years, however, it has been requested to monitor a characteristic of a memory cell transistor with more of correctness. For example, parasitic resistance of lead sections of source/drain regions 103 of a monitor transistor MT and direct contact resistance parasitizing source/drain regions 103 should be considered so as to be the smallest possible value since such parasitic resistance works as obstacles in correct evaluation of a transistor characteristic.

Furthermore, in order to perform quick feedback in development of a semiconductor device, a transistor characteristic is desirably evaluated not only in the final stage of a wafer process but also at a stage, particularly as early as possible, into a wafer process from the start thereof.

SUMMARY OF THE INVENTION

The present invention has been made in order to respond to a request as described above, and it is accordingly, an object of the present invention to provide a semiconductor device capable of monitoring a transistor characteristic correctly and easily by reducing parasitic resistance, further, at an early stage in a wafer process; and a method of manufacturing therefor.

A semiconductor device of the present invention is a semiconductor device having a monitor pattern for measuring a characteristic of a memory cell transistor included in a memory cell, having a monitor transistor; a first lead interconnection layer; and a second lead interconnection layer. The monitor transistor has a source impurity region and a drain impurity region. The first lead interconnection layer is electrically connected to the source impurity region and has a section to which a needle of a prober can be connected externally. The second lead interconnection layer is electrically connected to the drain impurity region and has a section to which a needle of a prober can be connected externally. The first and second lead interconnection layers are formed on the same layer and further, formed on the same layer as is one of a bit line conductive layer and a storage node conductive layer, electrically connected to the memory cell transistor.

According to a semiconductor device of the present invention, since the first and second lead interconnection layers have each sections to each of which the needle of a prober can be connected and are formed on the same layer as are a bit line and a storage node, a transistor characteristic can be monitored at a stage where the bit line and the storage node of a memory cell have been formed. Accordingly, since monitoring of a transistor characteristic can be performed at an early stage in a wafer process, thereby enabling quick feedback in development of a semiconductor device.

Furthermore, since no necessity arises for leading out the source and drain regions of a monitor transistor to the bonding pads in the uppermost layer, dissimilar to the prior art example, it is possible to reduce parasitic resistance of lead sections thereof, which makes it possible to monitor a transistor characteristic correctly and easily.

In the above semiconductor device, a material of the first and second lead interconnection layers are preferably made from metal.

With adoption of metal as material of the interconnection layers, the parasitic resistance of the lead sections can be further reduced, thereby enabling more correct monitoring of a transistor characteristic.

In the semiconductor device, the first and second lead interconnection layers are formed on the same layer as is the storage node conductive layer.

With such a structure, a detailed analysis of a transistor can be performed by comparative evaluation with one pattern.

In the above semiconductor device, the first and second lead interconnection layers are electrically connected to the bit line conductive layer and the storage node conductive layer, respectively, through pad layers.

With such a structure, a large margin for photolithography can be ensured on connection of a lead interconnect to a lower layer.

In the above semiconductor device, it is preferable that the pad layers are connected to one of the source impurity region and drain impurity region of one of the monitor transistor and to one of the source impurity region and drain impurity region of another the monitor transistor, and one of the first and second lead interconnection layers is connected to the almost middle section of the top surface of a pad layer.

With such a structure, a larger margin for photolithography can be ensured on connection of a lead interconnect to a lower layer.

A method of manufacturing a semiconductor device of the present invention is a method of manufacturing a semiconductor device having a monitor pattern for measuring a characteristic of a memory cell transistor included in a memory cell, including the following steps:

At first, a monitor transistor having a source impurity region and drain impurity region is formed. The first lead interconnection layer has a section which is electrically connected to the source impurity region and to which a needle of a prober can be connected externally. The second lead interconnection layer has a section which is electrically connected to the drain impurity region and to which a needle of a prober can be connected externally. The first and second lead interconnection layers are formed from the same layer as is one of the bit line conductive layer and the storage node conductive layer.

According to a method of manufacturing a semiconductor device of the present invention, since the first and second lead interconnection layers have respective sections to each of which the needle of a prober can be connected externally and are formed from the same layer as is a bit line or a storage node, a transistor characteristic can be monitored after the bit line and the storage node are formed. For this reason, a transistor characteristic can be evaluated at an early stage in a wafer process and in turn, quick feedback can be performed in development of a semiconductor device.

Furthermore, since no necessity arises for leading out a source impurity region and a drain impurity region up to bonding pads of the uppermost layer, parasitic resistance of lead sections can be reduced, thereby enabling correct measurement of a transistor characteristic with ease.

In the above method of manufacturing a semiconductor device, the process preferably further includes: a step of forming pad layers for electrically connecting the first and second lead interconnection layers to the source impurity region and drain impurity region, respectively, of a monitor transistor. The pad layers are formed so as to be connected to one of the source impurity region and drain impurity region of one of the monitor transistor and to one of the source impurity region and drain impurity region of another of the monitor transistor.

With such a structure, a large margin for photolithography can be ensured on connection of a lead interconnect to a lower layer.

In the above method of manufacturing a semiconductor device, the pad layers are preferably formed by transferring a pattern of a pad photomask using a photolithographic technique. The pad photomask has a first pattern each of whose features is located in a region corresponding to one of the source impurity region and drain impurity region of one of the monitor transistor, a second pattern each of whose features is located in a region corresponding to one of the source impurity region and drain impurity region of another of the monitor transistor and a third pattern for connecting features of the first and second patterns.

With such a photomask applied, there can be formed the pad layers connecting one of the source region and drain region of one of the monitor transistor to one of the source region and drain region of another of the monitor transistor with each other.

In the above method of manufacturing a semiconductor device, the third pattern has a feature width narrower than do the first and second patterns.

With such a third pattern adopted, a transfer pattern corresponding to the third pattern is harder to be connected to a transfer pattern of a pattern other than the first and second patterns when in a transfer operation of a mask pattern, thereby enabling a process margin for photolithography to increase.

In the above method of manufacturing a semiconductor device, the center of the third pattern is preferably shifted from an imaginary line connecting the centers of corresponding features of the first and second patterns therebetween.

With such a structure, since it becomes possible to place features of the third pattern spaced apart from features of a pattern other than the first and second patterns, a large process margin for photolithography can be ensured.

In the above method of manufacturing a semiconductor device, one of the first and second lead interconnection layers is formed so as to be connected to the pad layer through a contact hole. The contact hole is formed such that an almost middle portion of the top surface of the pad layer is exposed by transferring a pattern of a hole photomask with a photolithographic technique.

Since, in such a way, the contact hole is formed so as to expose the almost middle portion of the top surface of the pad layer, a large process margin for photolithography can be ensured.

In the method of manufacturing a semiconductor device, it is preferable that the hole photomask has a hole pattern one of whose features is located in a region corresponding to said contact hole and the center of the one feature of the hole pattern is shifted from the center of a feature of a pad pattern constituted of features of the first to third patterns only along one direction.

With such a structure, since each feature of the hole pattern can be placed spaced apart from features of a different pattern formed on the hole photomask, a large process margin for photolithography can be ensured.

In the above method of manufacturing a semiconductor device, the center of a feature of the hole pattern is shifted from the center of a corresponding feature of the pad pattern along not only one direction but also a direction perpendicular to the one direction.

With such a structure, since each of feature of a hole pattern can be located spaced apart from features of a different pattern formed on a hole photomask along not only one direction but also a direction perpendicular to the one direction, a larger process margin for photolithography can be ensured.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Description will be given of embodiments of the present invention based on the accompanying drawings below.

(First Embodiment)

Figure 1:
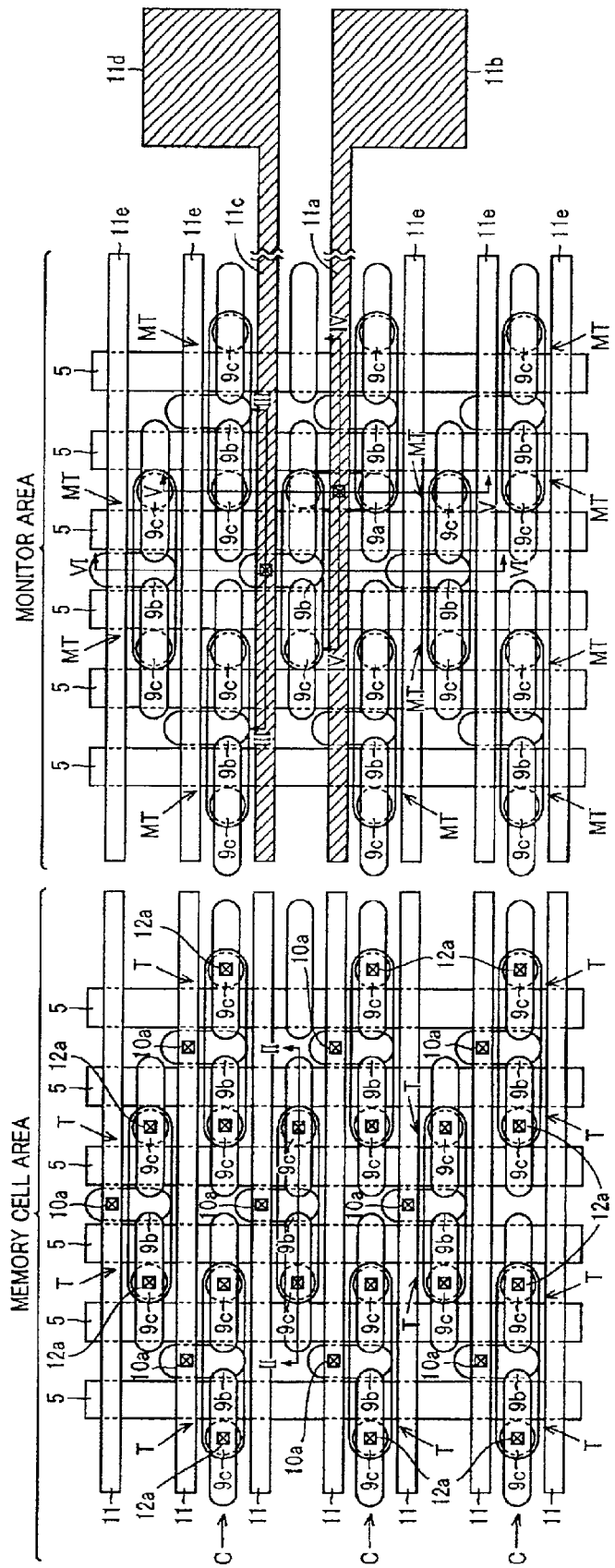
FIG. 1 is a plan view schematically showing a configuration of a semiconductor device in a first embodiment of the present invention.

Referring mainly to FIG. 1, in a case of a DRAM, plural word lines 5 and a plural bit lines 11 are arranged such that any one of the former and any one of the latter orthogonally intersect with each other, and memory cells are located in the vicinity of respective corresponding intersections of plural word lines 5 and plural bit lines 11. A memory cell has a one transistor one capacitor structure constituted of a memory transistor T and a capacitor C.

Figure 2:
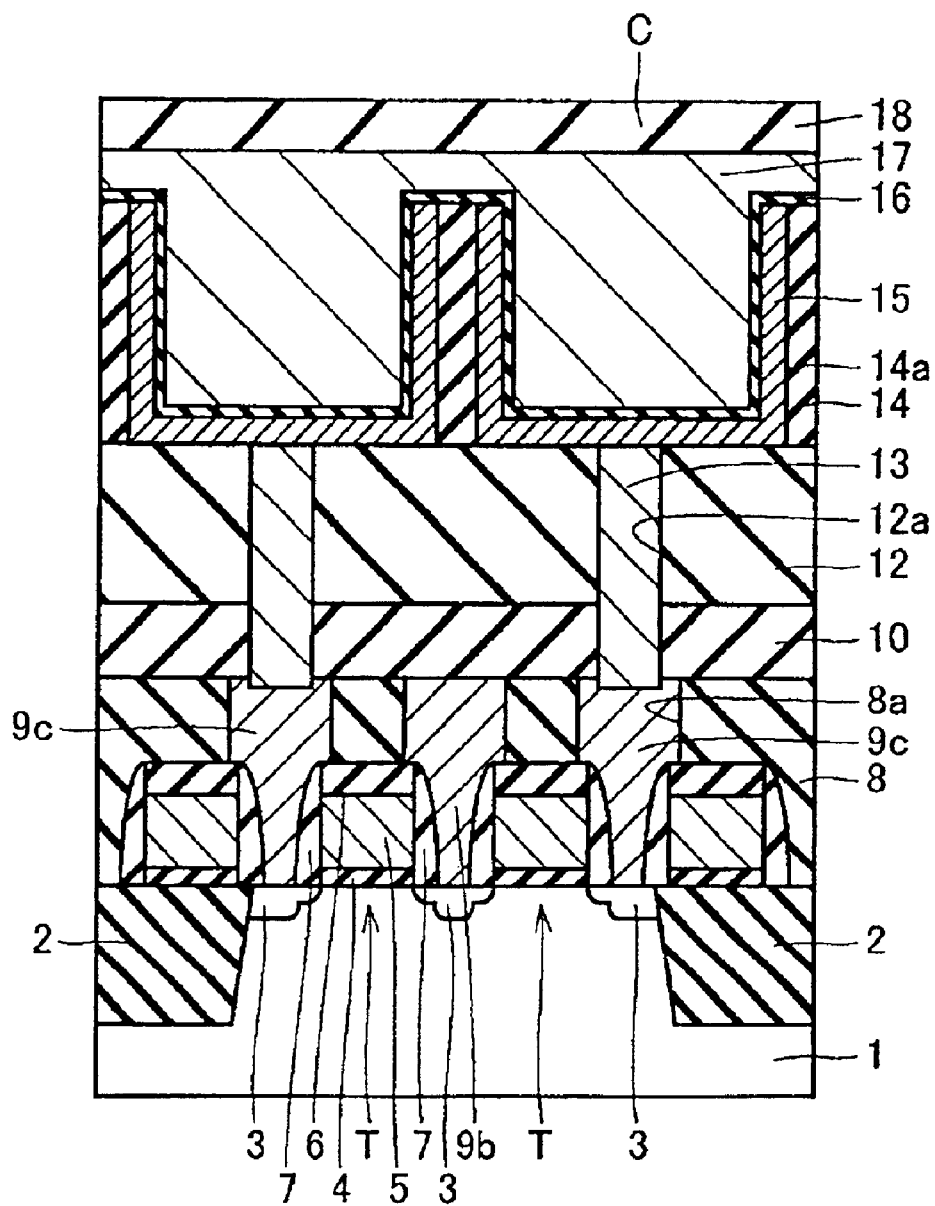
FIG. 2 is a schematic sectional view taken on line II—II of FIG. 1.

Referring mainly to FIGS. 1 and 2, memory cell transistor T is constituted of a MOS transistor and formed on a surface of a silicon substrate 1 electrically isolated by a trench isolation 2. Memory cell transistor T has: a pair of source/drain regions 3; a gate insulating layer 4; and a gate electrode layer 5.

Source/drain regions 3 of the pair are arranged spaced apart from each other on the surface of a silicon substrate 1. Gate electrode layer 5 is formed on a region sandwiched between source/drain regions 3 of the pair with gate insulating layer 4 interposing therebetween. Insulating layers 6 and 7 each constituted a silicon nitride film, for example, are formed so as to cover the top and side surfaces of gate electrode layer 5.

An interlayer insulating layer 8 is formed so as to cover memory cell transistor T and has holes 8a reaching respective source/drain regions 3 formed therein. Pad layers 9b and 9c are formed so as to fill holes 8a. An interlayer insulating layer 10 is formed on interlayer insulating layer 8 and bit lines 11 are formed on insulating layer 10. A bit line 11 is connected to pad layer 9b through a hole 10a formed in insulating layer 10.

An interlayer insulating layer 12 is formed so as to cover bit lines 11, and interlayer insulating layers 10 and 12 have holes 12a reaching pad layer 9c therethrough. Plug layer 13 fills holes 12a therein. Capacitor C is formed so as to be electrically connected to a source/drain region 3 through plug layer 13 and pad layer 9c.

Capacitor C has: a storage node (a lower electrode) 15; a capacitor dielectric layer 16; and a cell plate (an upper electrode) 17. Storage node 15 is formed along an inner wall of a hole 14a formed in an insulating layer 14 and at the same time, connected to plug layer 13. Cell plate 17 is formed opposite to storage node 15, both sandwiching capacitor dielectric layer 16 therebetween. An insulating layer 18 is formed so as to cover capacitor C.

Referring mainly to FIG. 1, there is included a monitor area for monitoring a characteristic of memory cell transistors T in the system. Formed in the monitor area are plural monitor transistors MT each having a configuration similar to that of a memory cell transistor T. Furthermore, formed in the monitor area are lead interconnection layers 11a and 11c lead out from source/drain regions of a monitor transistor MT for monitoring a characteristic thereof. Detailed description will be given of a configuration of the monitor area below.

Referring to FIGS. 1 and 3 to 6, formed in the monitor area are monitor transistors MT each having a configuration similar to that of a memory cell transistor T as described above. Interlayer insulating layer 8 is formed so as to cover monitor transistors MT and has plural holes 8a reaching source/drain regions 3 of monitor transistors MT formed therein. Pad layers 9a, 9b and 9c are formed inside respective corresponding holes 8a. Especially, pad layers 9a are formed so as to be connected to both of source/drain regions 3 of a pair of a monitor transistor MT. Interlayer insulating layer 10 is formed on interlayer insulating layer 8 and has plural holes 10a reaching both of pad layers 9a and 9b formed therein.

Formed on interlayer insulating layer 10 are lead interconnection layers 11a and 11c for leading out respective source/drain regions 3 of a pair of a monitor transistor MT.

Figure 4:
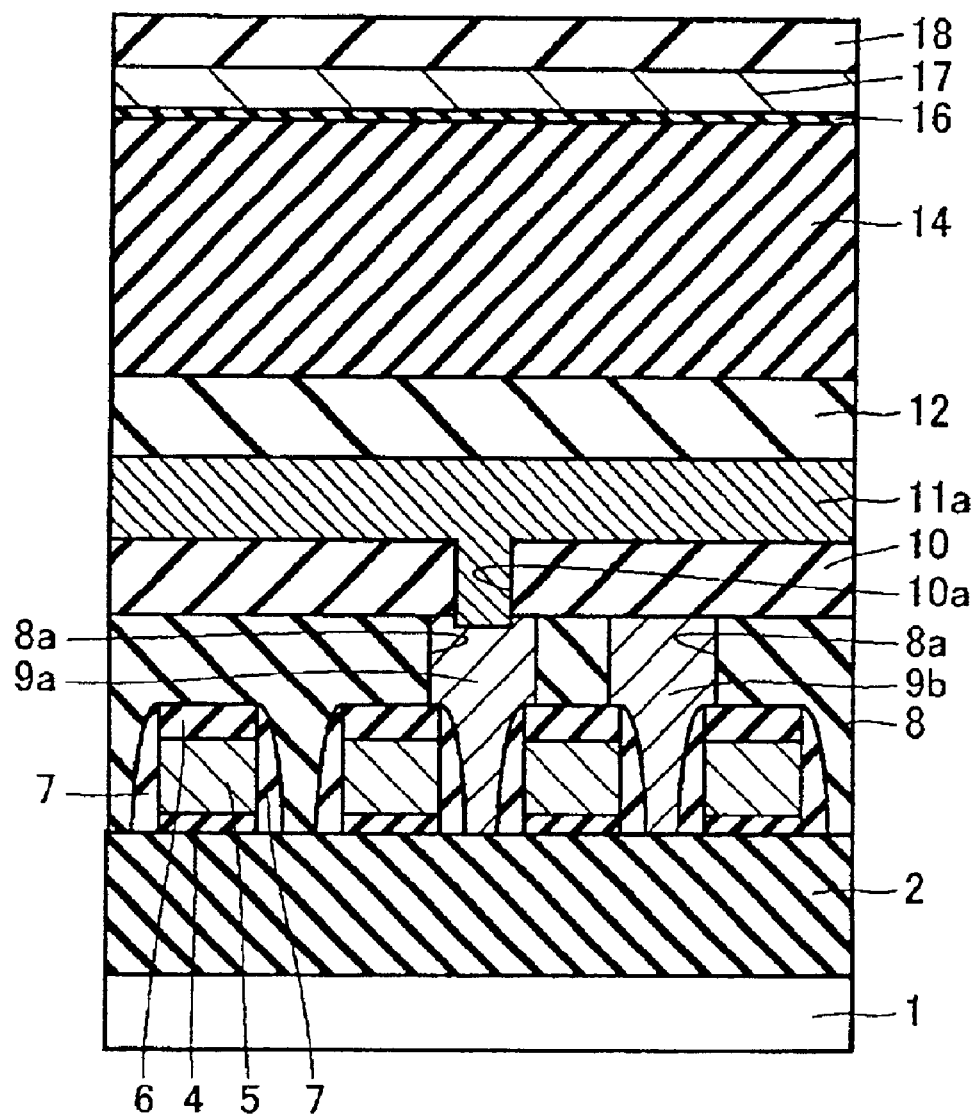
FIG. 4 is a schematic sectional view taken on line IV—IV of FIG. 1.
Figure 5:
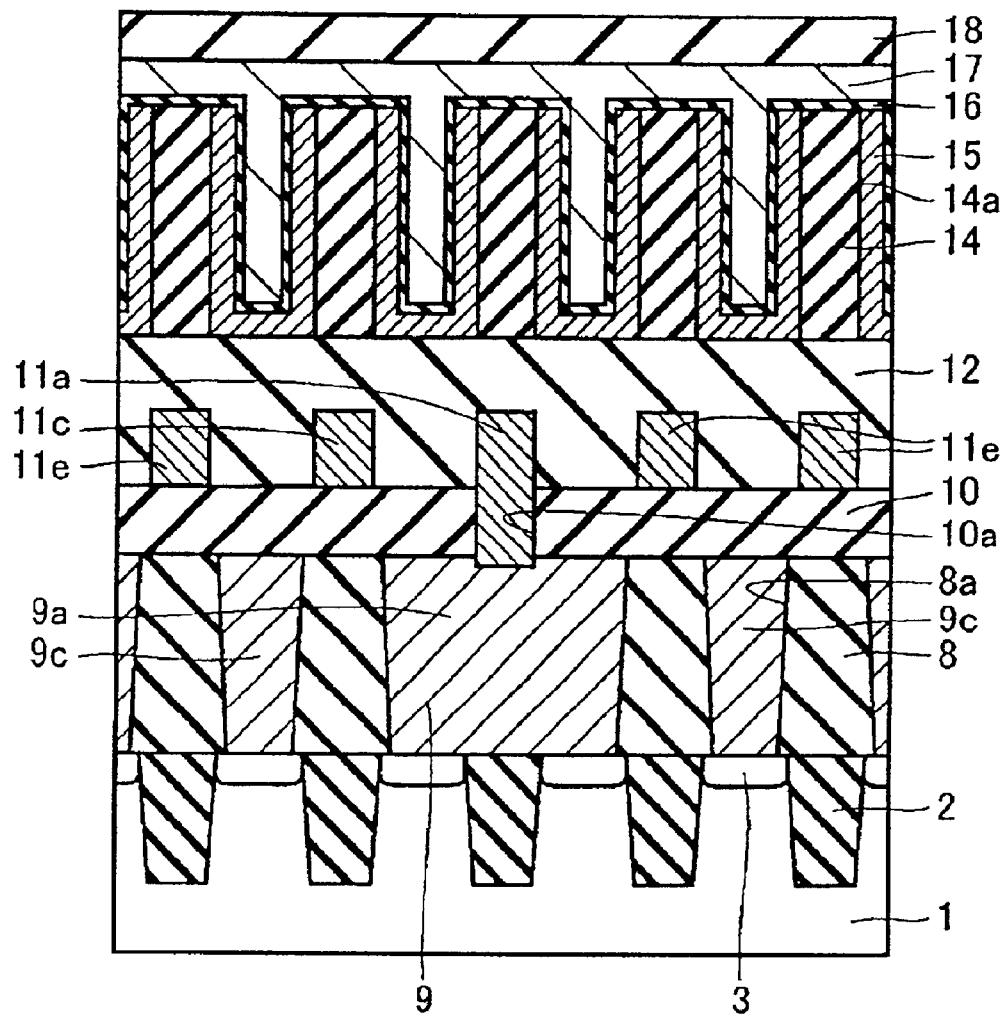
FIG. 5 is a schematic sectional view taken on line V—V of FIG. 1.

Referring mainly to FIGS. 4 and 5, lead interconnection layer 11a is connected to pad layer 9a through hole 10a and further electrically connected to one of source/drain regions 3 of a pair through pad layer 9a.

Figure 3:
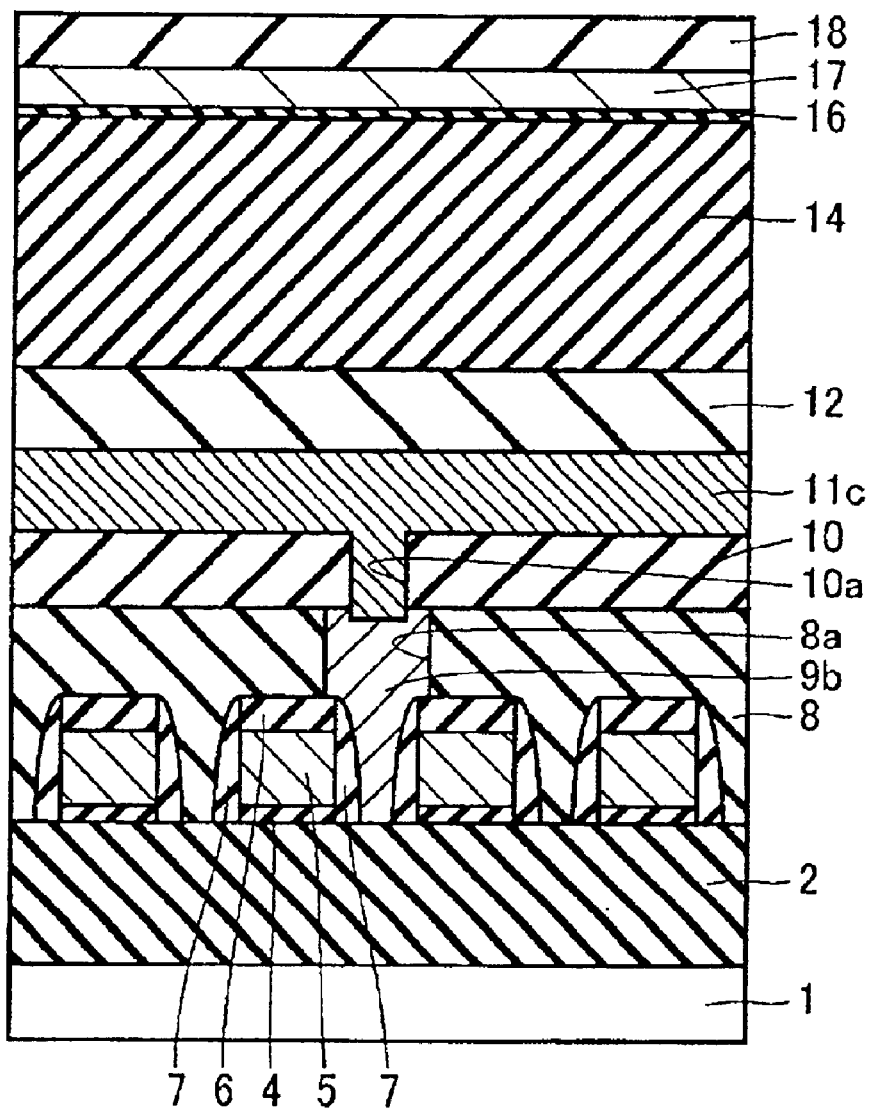
FIG. 3 is a schematic sectional view taken on line III—III of FIG. 1.
Figure 6:
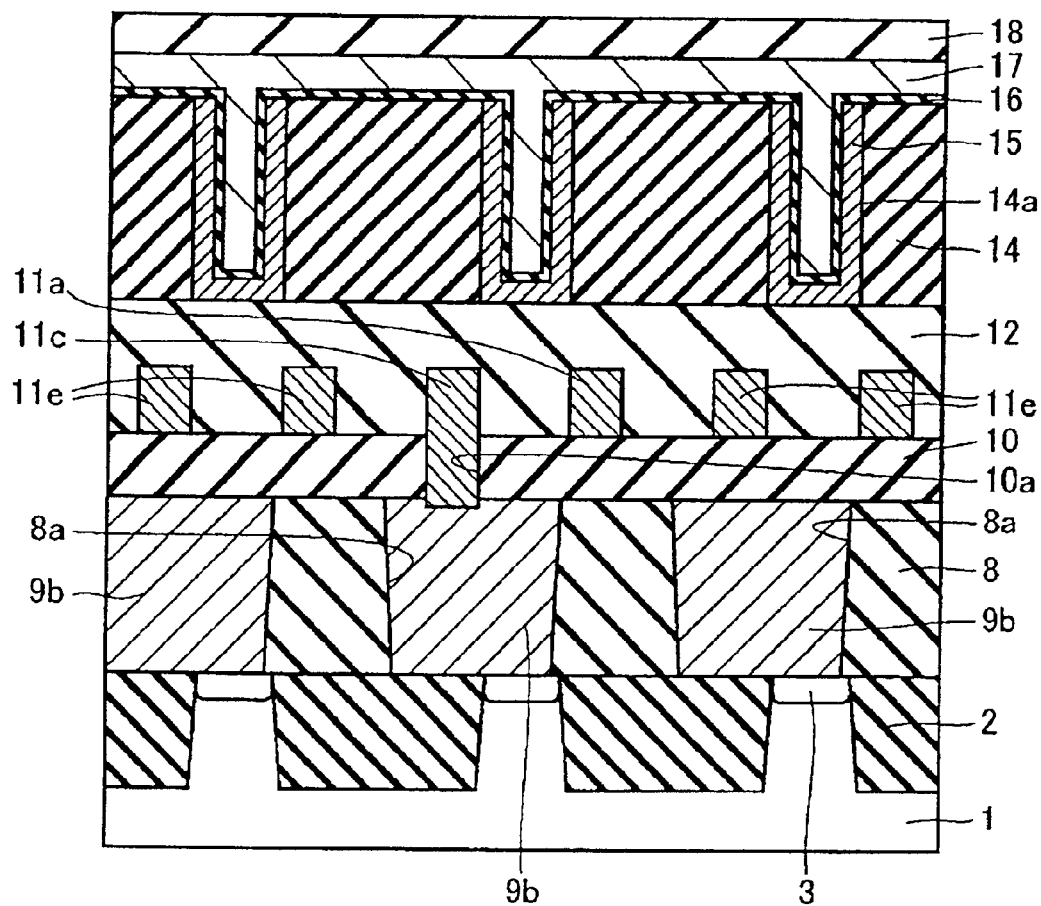
FIG. 6 is a schematic sectional view taken on line VI—VI of FIG. 1.

Referring mainly to FIGS. 3 and 6, lead interconnection layer 11c is connected to pad layer 9b through hole 10a and further electrically connected to the other of source/drain regions 3 of a pair through pad layer 9b.

Furthermore, formed on interlayer insulating layer 10 is plural conductive layers 11e in addition to lead interconnection layers 11a and 11c. Lead interconnection layers 11a and 11c, and plural conductive layers 11e are formed from the same layer as are bit lines 11 of the memory cell area and formed on same insulating layer 10. Lead interconnection layers 11a and 11c have respective contact sections 11b and 11d each with a large width to each of which a needle of a prober can be connected. Lead interconnection layers 11a and 11c are each preferably made form a metal layer.

Note that, in the present application, the term, "to be formed from the same layer" means that when a single layer is subjected to patterning with a photolithographic technique and an etching technique, separate layers are formed from the single layer.

Lead interconnection layers 11a and 11c and plural conductive layers 11e are covered by interlayer insulating layer 12. An interlayer insulating layer 14 having holes 14a is formed on interlayer insulating layer 12 and a conductive layer 15 is formed along the inner wall of each of holes 14a. While conductive layer 15 is formed on same insulating layer 12 as is storage node 15 of the memory cell area, conductive layer 15 is a dummy storage node and not electrically connected to a source/drain region 3 of a monitor transistor MT. Note that conductive layer 15 may be electrically connected to source/drain region 3 of a monitor transistor MT.

Formed on conductive layer 15 are an insulating layer 16, a conductive layer 17 and insulating layer 18. Insulating layer 16 is formed from the same layer as is capacitor dielectric layer 16 of the memory cell area and conductive layer 17 is formed from the same layer as is cell plate 17 of the memory cell area.

Next, description will be given of a fabrication process of the embodiment.

Referring to FIGS. 2 to 6, trench isolation 2 is formed on the surface of silicon substrate 1. An insulating layer serving as a gate insulating layer and a conductive layer serving as a gate electrode layer are stacked on the surface of silicon substrate 1 and thereafter, the insulating layer and the conductive layer are patterned with an ordinary photolithographic technique and an ordinary etching technique to form gate insulating layer 4, gate electrode layer 5 and insulating layer 6.

By implanting an impurity into silicon substrate 1 with gate electrode layer 5 and the like as a mask, low concentration regions for source/drain regions 3 are formed. Thereafter, an insulating layer is formed on all of the surface and then, etching back is performed on all of the surface of the insulating layer to form a sidewall insulating layer 7 covering a sidewall of gate electrode layer 5.

Thereafter, ion implantation is again performed on silicon substrate 1 with gate electrode layer 5, sidewall insulating layer 7 or the like as a mask to form high concentration regions for source/drain regions 3 and thereby, form source/drain regions 3 of the LDD structure constituted of the low and high concentration regions. In such a way, a memory cell transistor T and a monitor transistor MT are formed.

Interlayer insulating layer 8 is formed so as to cover memory cell transistors T and monitor transistors MT. Formed in interlayer insulating layer 8 are holes 8a exposing the surfaces of source/drain regions 3 by an ordinary photolithographic technique and an ordinary etching technique combined. Pad layers 9a, 9b and 9c are formed so as to fill the inside of respective corresponding ones of plural holes 8a.

Interlayer insulating layer 10 is formed on interlayer insulating layer 8. Formed in interlayer insulating layer 10 are a hole 10a reaching pad layer 9b in the memory cell area, while holes 10a reaching pad layers 9b and 9a in the monitor area, by an ordinary photolithographic technique and an ordinary etching technique combined. A conductive layer serving as bit lines and lead interconnects is formed on interlayer insulating layer 10. By patterning the conductive layer using an ordinary photolithographic technique and an ordinary etching technique combined, there are formed plural bit lines 11, lead interconnection layer 11a, lead interconnection layer 11c and plural conductive layers 11e.

In the memory cell area, plural bit lines 11 are connected to respective pad layers 9b through holes 10a. On the other hand, in the monitor area, lead interconnection layer 11a are formed so as to be connected to pad layers 9a through holes 10a, and lead interconnection layer 11c are formed so as to be connected to pad layers 9b through holes 10a.

Interlayer insulating layer 12 is formed so as to cover bit lines 11, lead interconnection layers 11a and 11c and conductive layers 11e. Holes 12a reaching pad layers 9c are formed in the memory cell area of interlayer insulating layers 12 and 10 by an ordinary photolithographic technique and an ordinary etching technique. Plug layers 13 are formed in holes 12a.

Interlayer insulating layer 14 is formed on interlayer insulating layer 12 and holes 14a are formed in interlayer insulating layer 14 by an ordinary photolithographic technique and an ordinary etching technique. In the memory cell area, a storage node 15 is formed in a hole 14a, while in the monitor area, a dummy storage node 15 are formed in a hole 14a. There are formed the insulating layer serving as capacitor dielectric layer 16 and the conductive layer serving as cell plate 17 so as to cover storage nodes 15 and dummy storage nodes 15. Furthermore, insulating layer 18 is formed on cell plate 17 to thereby, fabricate a semiconductor device of the embodiment.

In the embodiment, lead interconnection layers 11a and 11c for leading out source/drain regions 3 of a monitor transistor MT are formed from the same layer as are bit lines 11 of the memory cell area and have respective contact sections 11b and 11d to each of which a needle of a prober can be connected. For this reason, it becomes possible to monitor a transistor characteristic of a monitor transistor MT at a stage in a wafer process where the bit lines have been formed. Hence, monitoring a transistor characteristic can be performed at an earlier stage in the wafer process in the embodiment than in a prior art example where the transistor characteristic is monitored after all of the wafer process is over, thereby enabling quick feedback in development of a semiconductor device.

Furthermore, in the embodiment, since lead interconnection layers 11a and 11c have respective contact sections 11b and 11d, there arises no necessity for extending source/drain regions 3 of a monitor transistor MT up to the bonding pads in the uppermost layer as in the prior art example. Therefore, parasitic resistance of lead-out sections of the source/drain regions of a monitor transistor MT can be reduced, thereby enabling correct evaluation of a transistor characteristic with ease.

Moreover, since lead interconnection layers 11a and 11c are made from metal, parasitic resistance of lead interconnection layers 11a and 11c themselves can be reduced. Therefore, a correct monitoring of a transistor characteristic of a monitor transistor MT can be performed with more of ease.

(Second Embodiment)

Referring to FIGS. 7 to 11, a structure of the embodiment is different from the structure of the first embodiment by comparison therewith in that lead interconnection layers 15a and 15c for leading out source/drain regions 3 of a monitor transistor MT are formed from the same layer and on same interlayer insulating layer 12 as is storage nodes 15 in the memory cell area.

Lead interconnection layers 15a and 15c are formed on interlayer insulating layer 12 and further each formed along the inner wall of a hole 14a of insulating layer 14. Lead interconnection layer 15a is electrically connected to one of source/drain regions 3 of a pair of a monitor transistor MT through plug layer 13 and pad layer 9c. Furthermore, lead interconnection layer 15a has contact section 15b with a large width, to which a needle of a probe can be connected. Lead interconnection layer 15c is electrically connected to the other of source/drain regions 3 of a pair of monitor transistor MT through plug layer 13 and pad layer 9b. Lead interconnection layer 15c also has a contact section, not shown, with a large width, to which a needle of a probe can be connected.

Note that, for convenience in description, the contact section of lead interconnection layer 15c is omitted in the figure.

Figure 7:
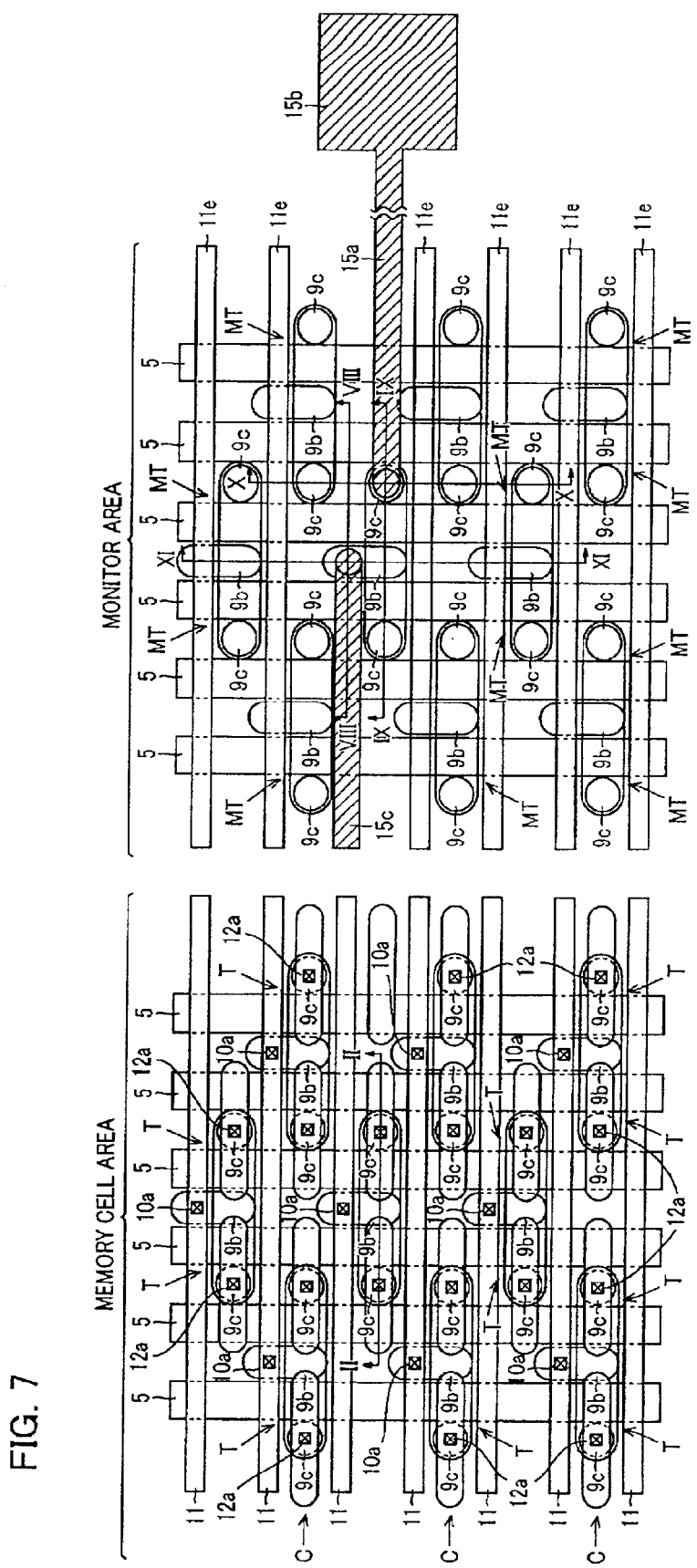
FIG. 7 is a plan view schematically showing a configuration of a semiconductor device in a second embodiment of the present invention.
Figure 8:
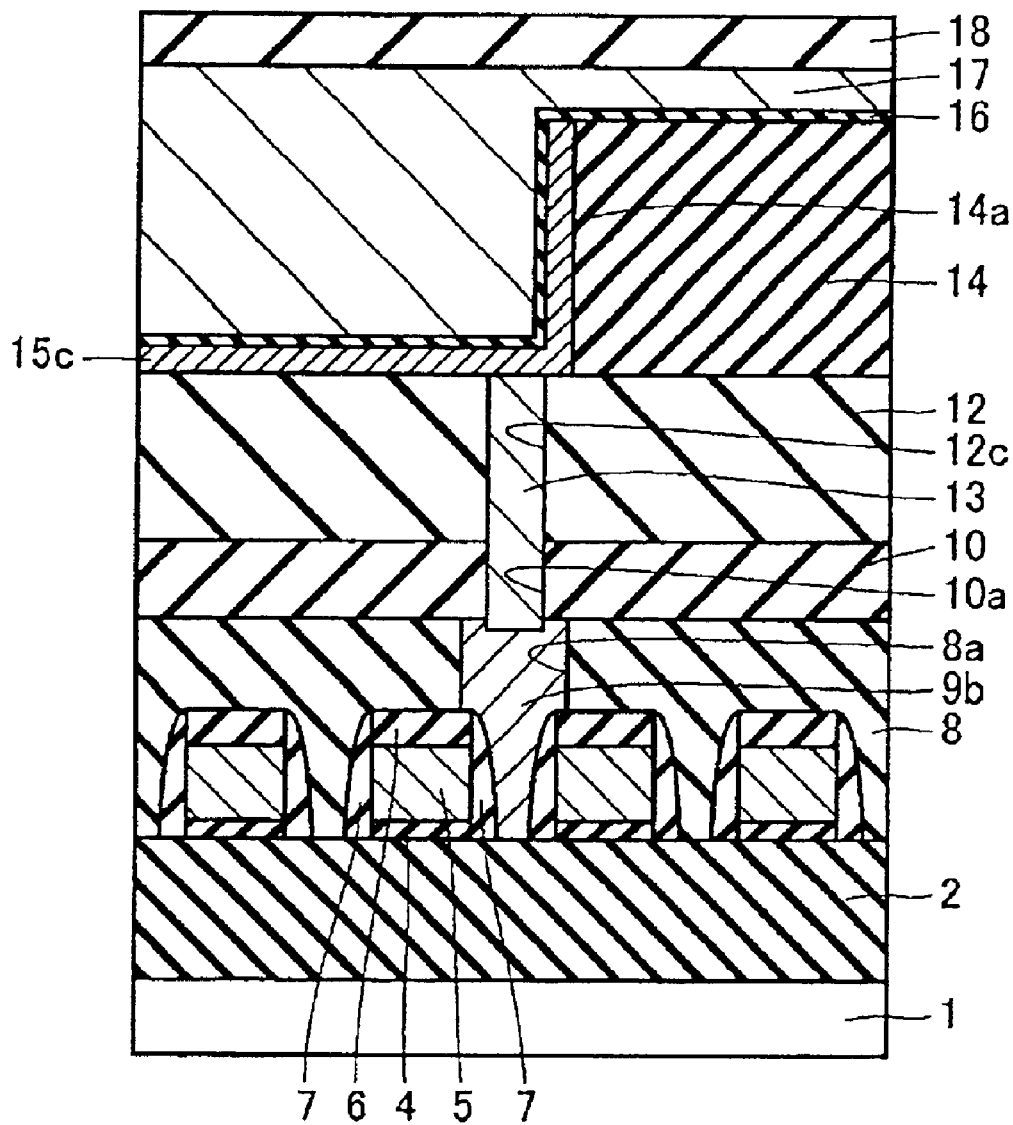
FIG. 8 is a schematic sectional view taken on VIII—VIII of FIG. 7.
Figure 9:
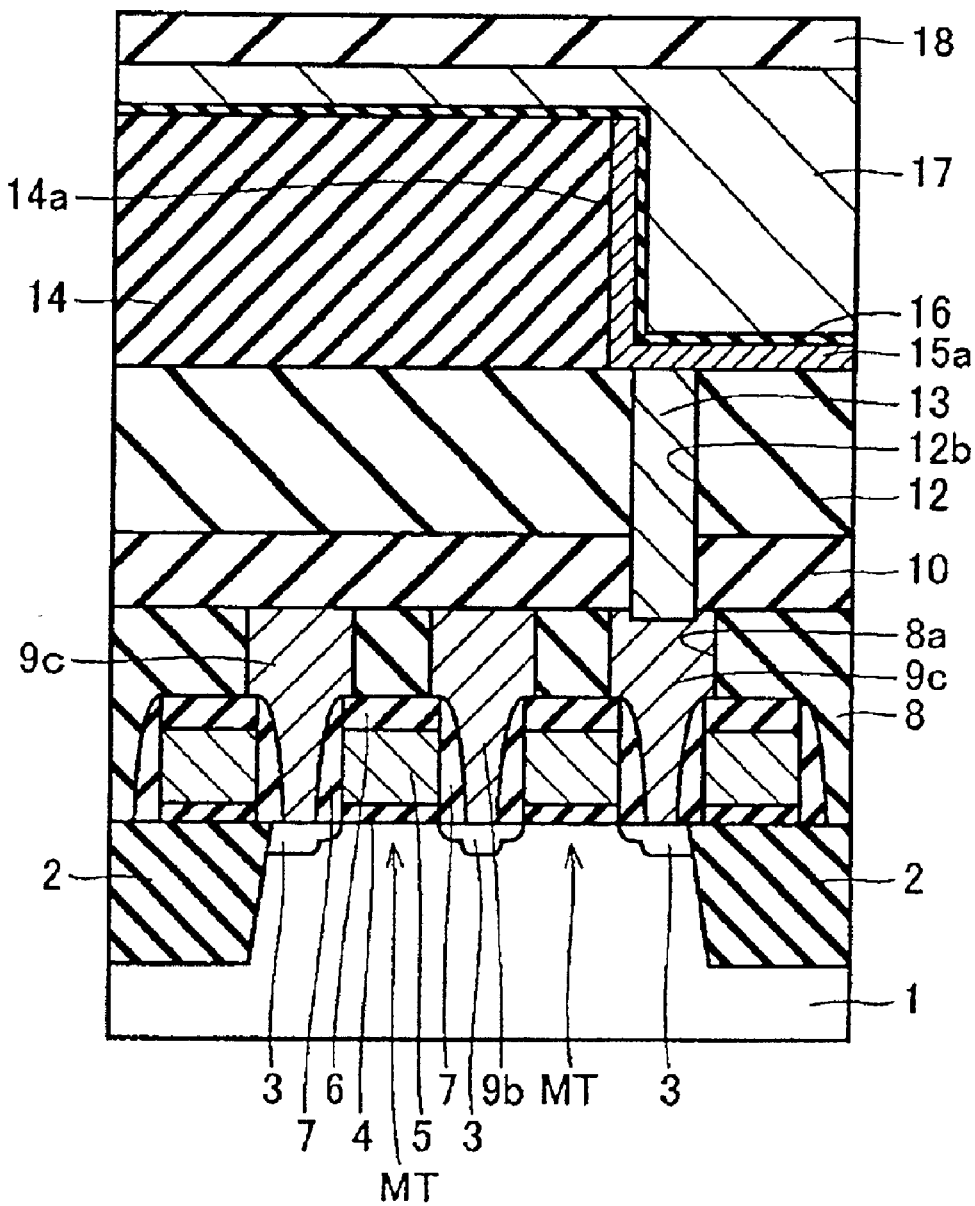
FIG. 9 is a schematic sectional view taken on IX—IX of FIG. 7.
Figure 10:
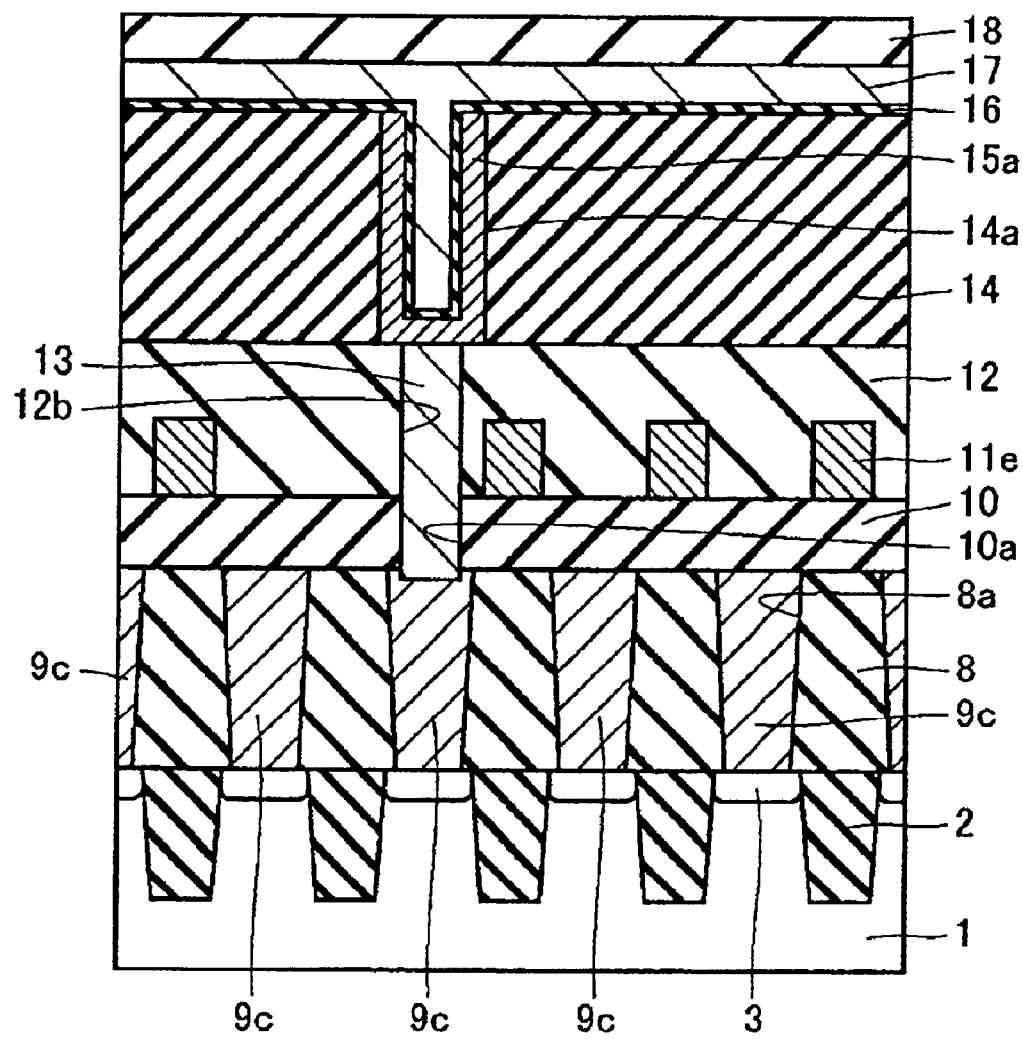
FIG. 10 is a schematic sectional view taken on X—X of FIG. 7.
Figure 11:
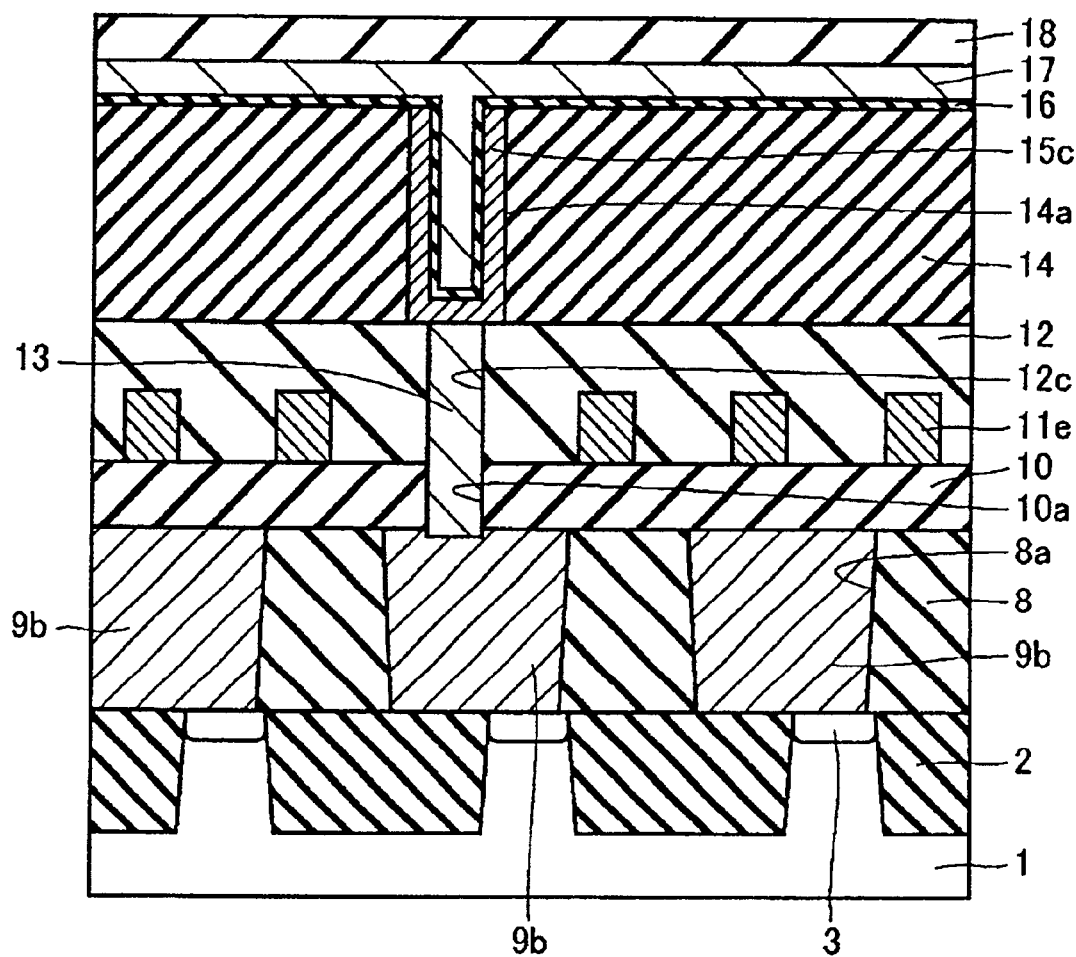
FIG. 11 is a schematic sectional view taken on XI—XI of FIG. 7.
Figure 12:
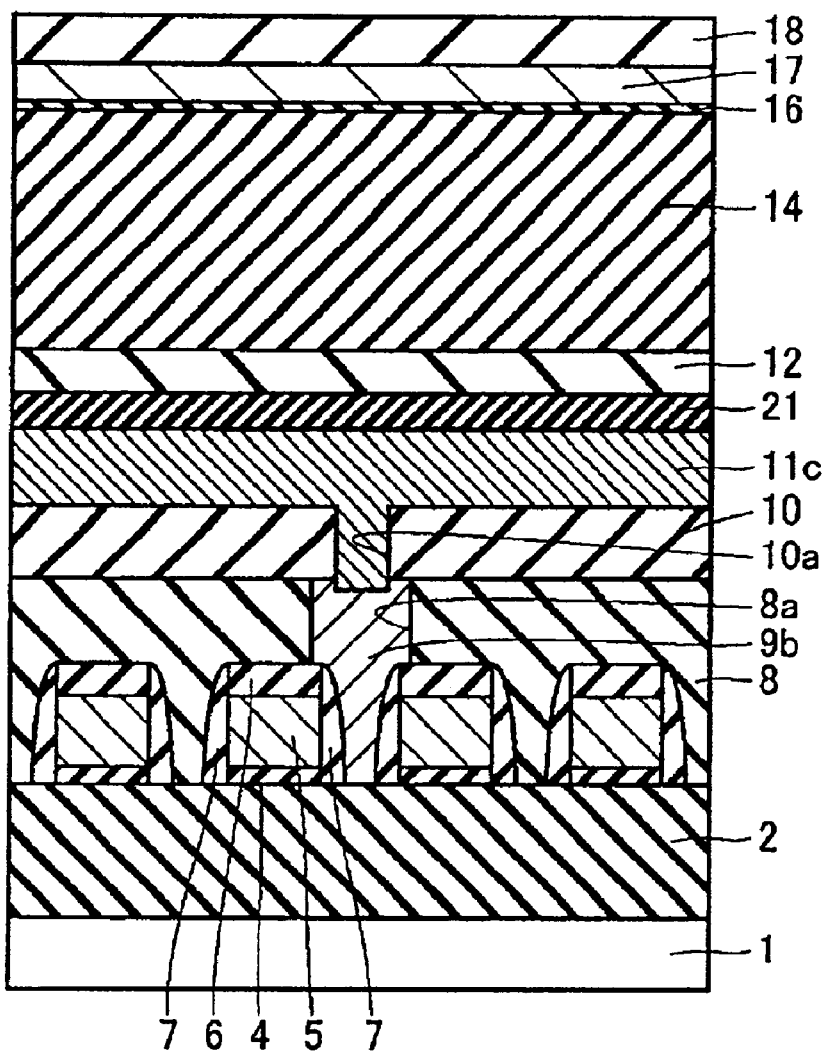
FIG. 12 is a schematic sectional view showing a structure of a semiconductor device in a third embodiment of the present invention in correspondence with the sectional view taken on line III—III of FIG. 1.
Figure 13:
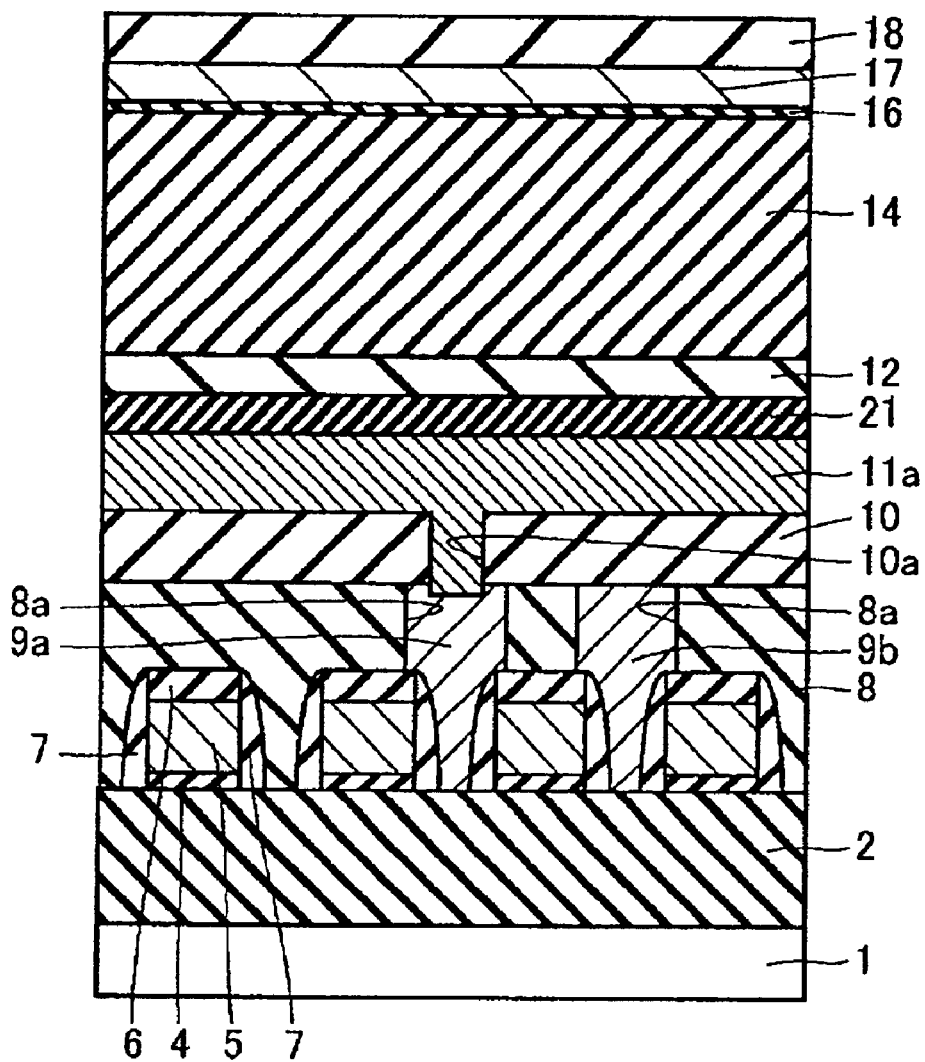
FIG. 13 is a schematic sectional view showing a structure of the semiconductor device in a third embodiment of the present invention in correspondence with the sectional view taken on line IV—IV of FIG. 1.
Figure 14:
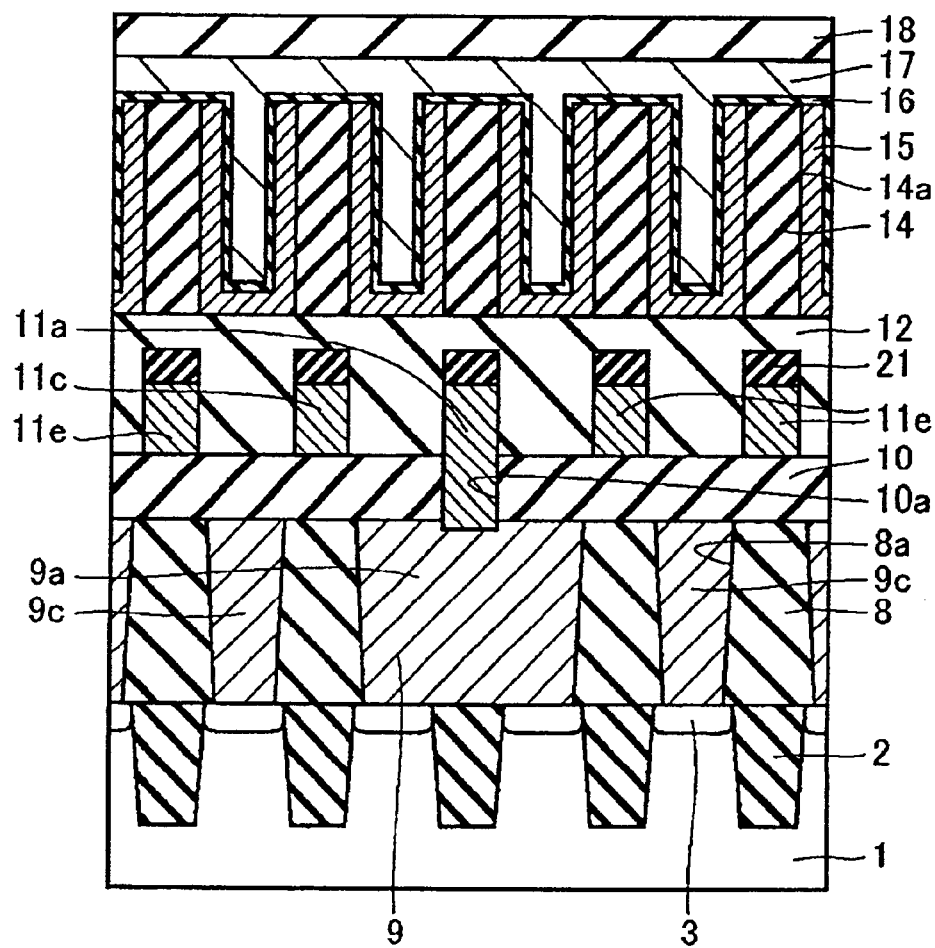
FIG. 14 is a schematic sectional view showing a structure of the semiconductor device in a third embodiment of the present invention in correspondence with the sectional view taken on line V—V of FIG. 1.
Figure 15:
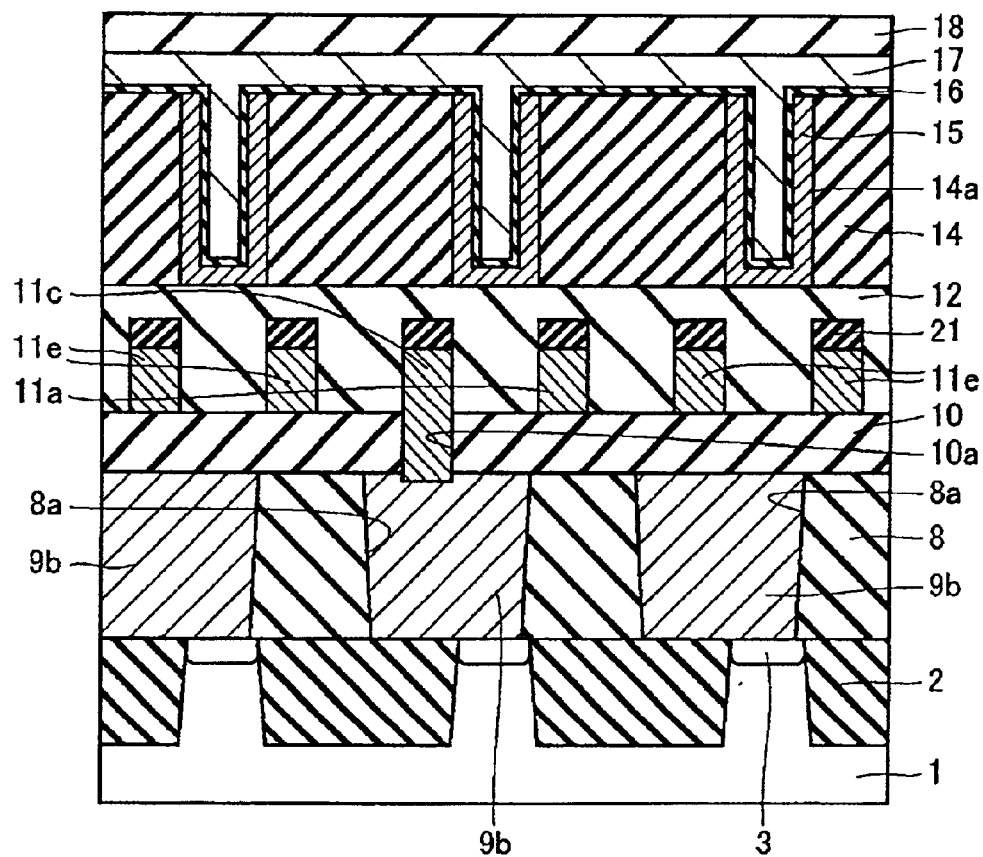
FIG. 15 is a schematic sectional view showing a structure of the semiconductor device in a third embodiment of the present invention in correspondence with the sectional view taken on line IV—IV of FIG. 1.

Conductive layers 11e is not formed in a region direct below lead interconnection layer 15c. This is because it is prevented from occurring that conductive layers 11e hinders connection between lead interconnection layer 15c and pad layer 9b. No dummy storage node is formed either in the monitor area. The structure as viewed in section taken on line II—II in the memory cell area of FIG. 7 is the same as that of FIG. 2.

Note that a structure other than as described above is almost the same as the corresponding structure of the first embodiment, so the same symbols are attached to the same constituents and description thereof is omitted.

In the embodiment, since lead interconnection layers 15a and 15c have respective contact sections 15b and 15c, a transistor characteristic can be monitored at a stage where storage nodes have been formed in a wafer process. Hence, quick feedback can be expected in development of a semiconductor device.

Since no necessity arises for leading out source/drain regions 3 of a monitor transistor MT up to bonding pads in the uppermost layer, parasitic resistance of the lead sections can be reduced. Furthermore, by forming lead interconnection layers 15a and 15c from a metal layer, the parasitic resistance of the lead sections can be further reduced.

(Third Embodiment)

Referring to FIGS. 12 to 15, a structure of the embodiment is different from the structure of the first embodiment by comparison therewith in that a silicon nitride film 21 is additionally formed on bit lines 11, lead interconnection layers 11a and 11b and conductive layers 11e.

Note that a structure other than as described above is almost the same as the corresponding structure of the first embodiment, so the same symbols are attached to the same constituents and description thereof is omitted.

In the embodiment, silicon nitride film 21 is formed on bit lines 11, lead interconnection layers 11a and 11b, and conductive layers 11e, all made from metal. Therefore, silicon nitride film 21 exerts an antireflection effect and others in patterning of bit lines 11, lead interconnection layers 11a and 11b, and conductive layers 11e by a photolithographic technique, thereby improving dimensional uniformity in etching applied to patterning into very fine interconnects.

(Fourth Embodiment)

Figure 16:
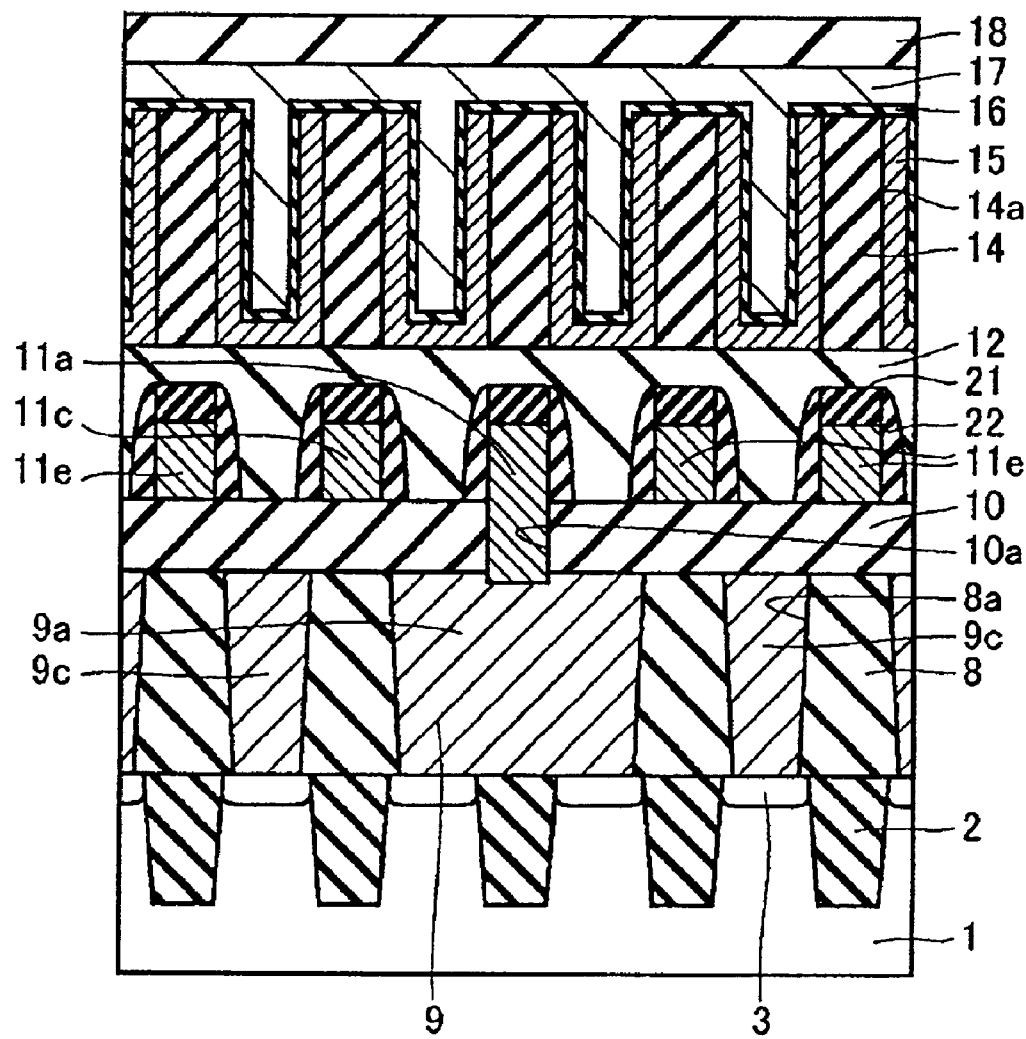
FIG. 16 is a schematic sectional view showing a structure of a semiconductor device in a fourth embodiment of the present invention in correspondence with the sectional view taken on line V—V of FIG. 1.
Figure 17:
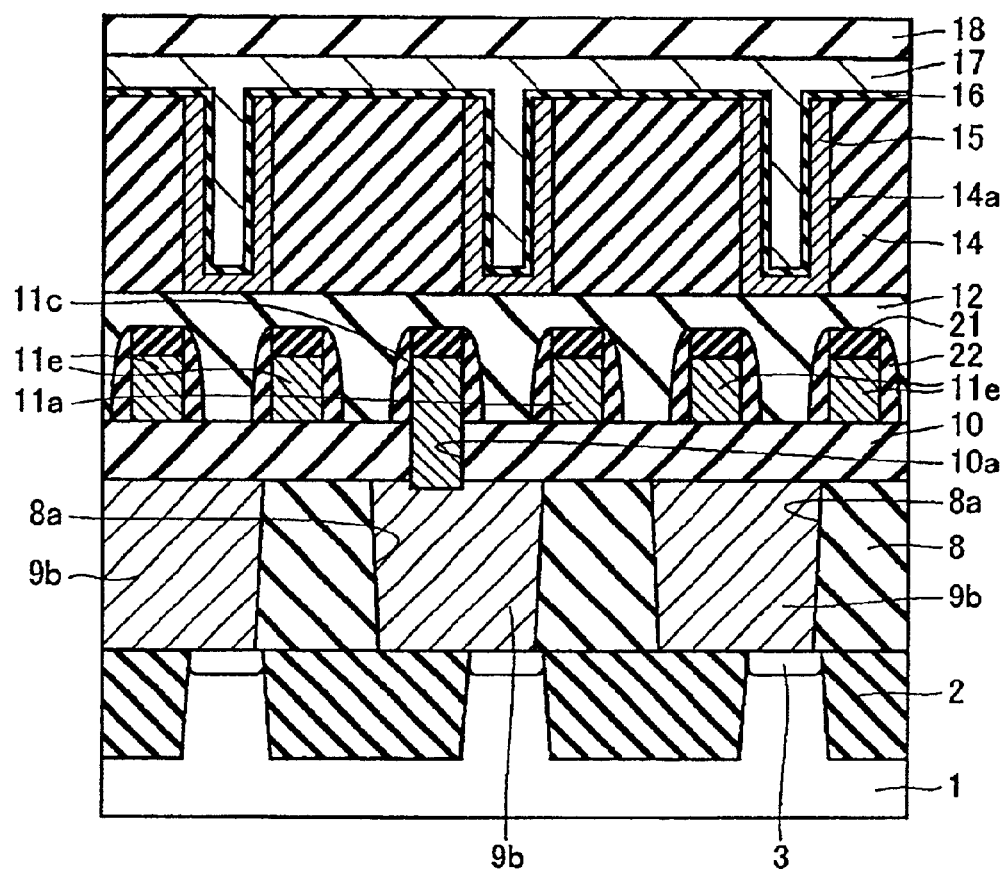
FIG. 17 is a schematic sectional view showing a structure of the semiconductor device in a fourth embodiment of the present invention in correspondence with the sectional view taken on line VI—VI of FIG. 1.

Referring to FIGS. 16 and 17, a structure of the embodiment is different from the structure of the first embodiment by comparison therewith in that bit lines 11, lead interconnection layers 11a and 11b and conductive layers 11e are covered by silicon nitride films 21 and 22 on the respective top and side surfaces thereof. Structures as viewed on sections corresponding to the sections taken on lines III—III and IV—IV of FIG. 1 are the same as those of FIGS. 12 and 13.

Note that a structure other than as described above is almost the same as the corresponding structure of the first embodiment, so the same symbols are attached to the same constituents and description thereof is omitted.

In the embodiment, silicon nitride films 21 and 22 are formed on bit lines 11, lead interconnection layers 11a and 11b, and conductive layers 11e so as to cover them. Therefore, a selectivity ratio of silicon nitride films 21 and 22 to a silicon oxide film such as interlayer insulating layer 12 can be ensured to be larger than 1 in opening for storage node contacts, thereby enabling etching of self alignment contact.

(Fifth Embodiment)

Figure 18:
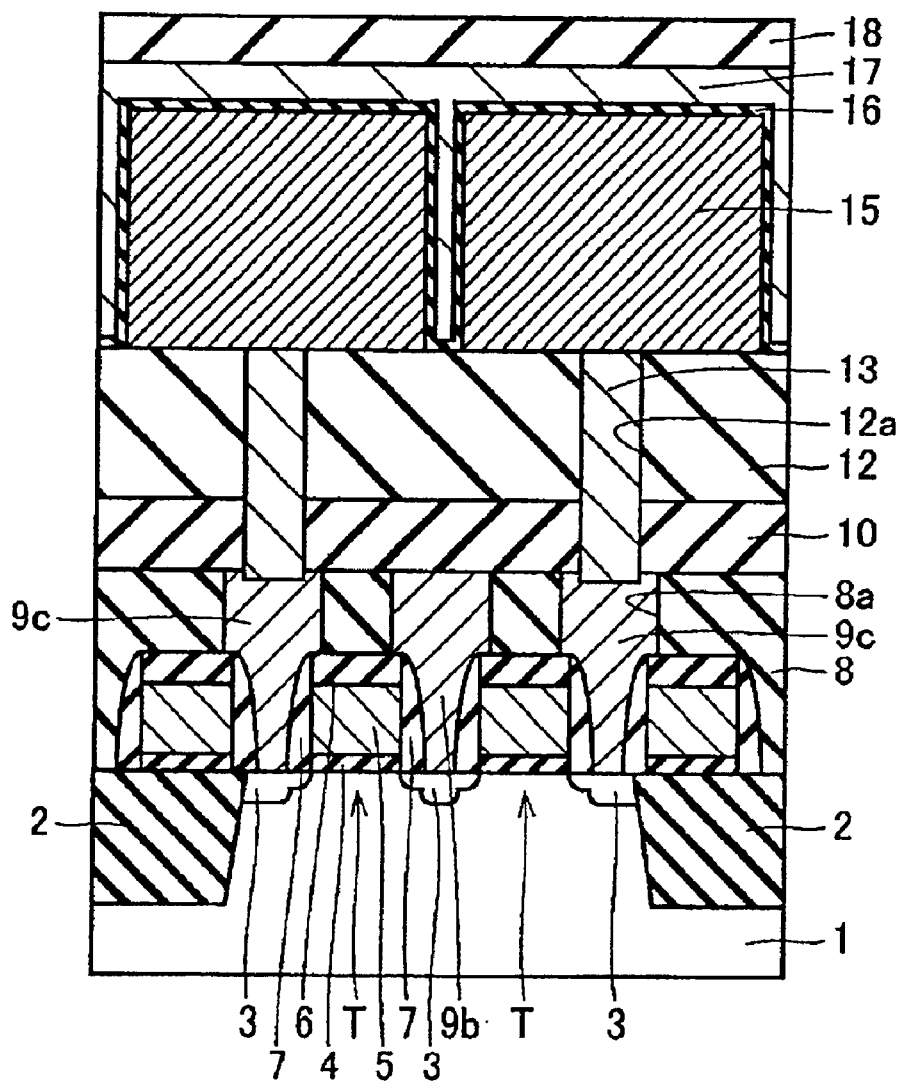
FIG. 18 is a schematic sectional view showing a structure of a semiconductor device in a fifth embodiment of the present invention in correspondence with the sectional view taken on line II—II of FIG. 7.
Figure 19:
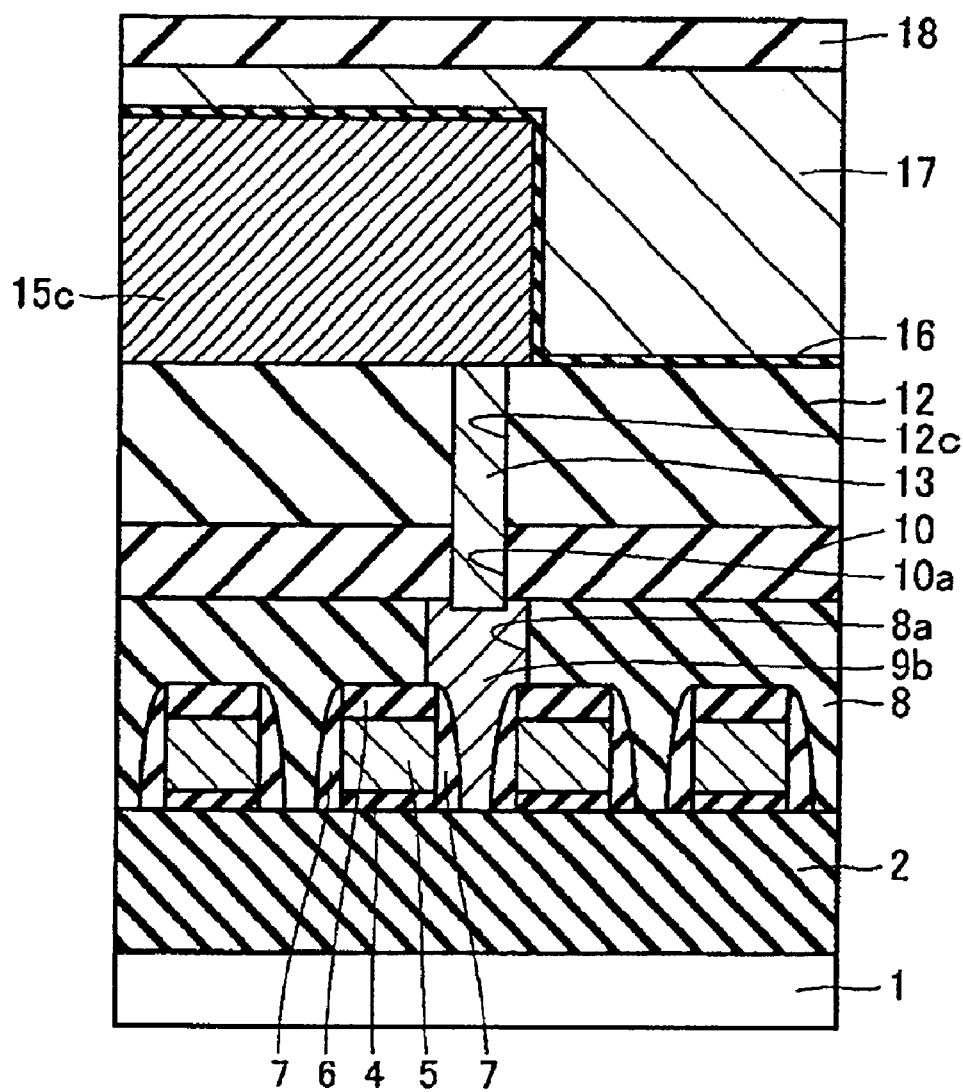
FIG. 19 is a schematic sectional view showing a structure of the semiconductor device in a fifth embodiment of the present invention in correspondence with the sectional view taken on line VIII—VIII of FIG. 7.
Figure 20:
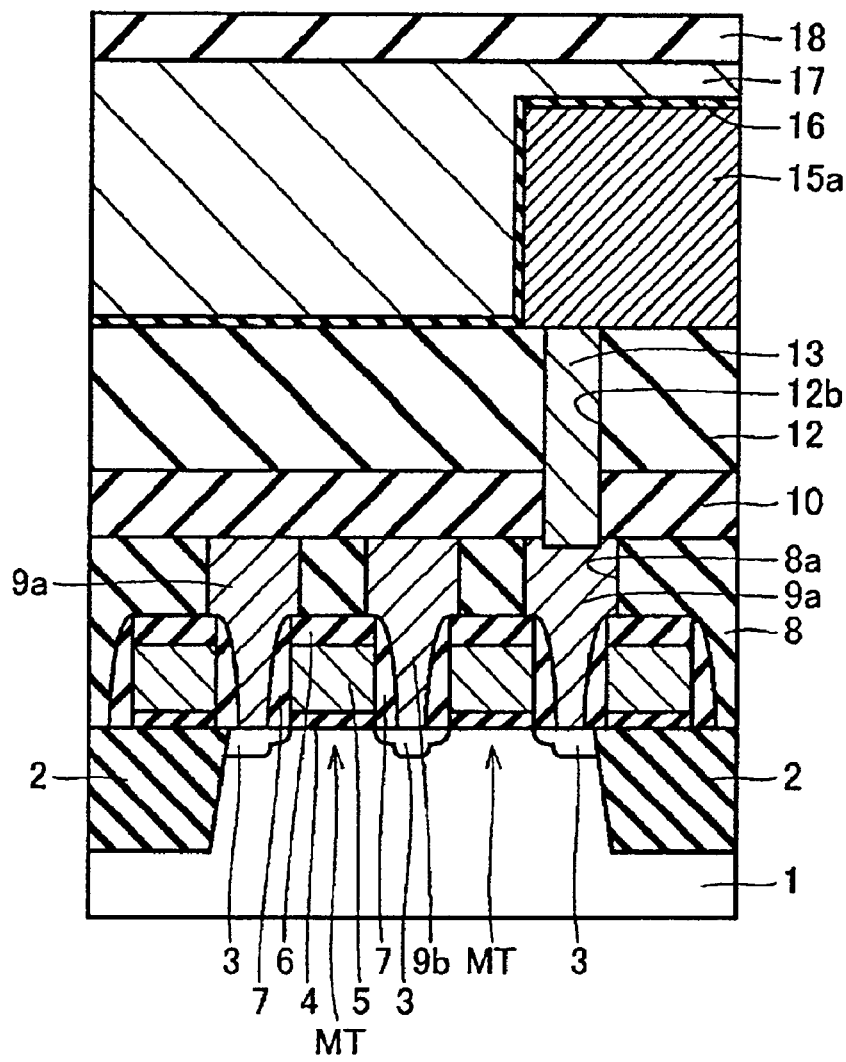
FIG. 20 is a schematic sectional view showing a structure of the semiconductor device in a fifth embodiment of the present invention in correspondence with the sectional view taken on line IX—IX of FIG. 7.
Figure 21:
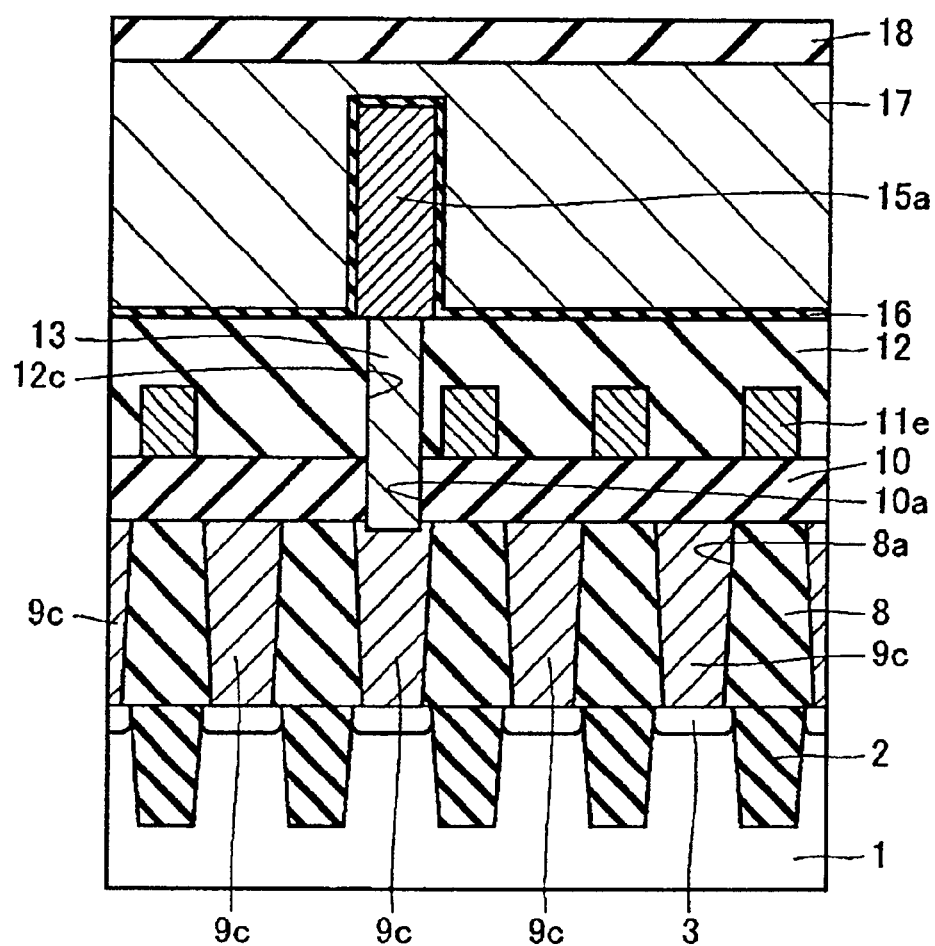
FIG. 21 is a schematic sectional view showing a structure of the semiconductor device in a fifth embodiment of the present invention in correspondence with the sectional view taken on line X—X of FIG. 7.
Figure 22:
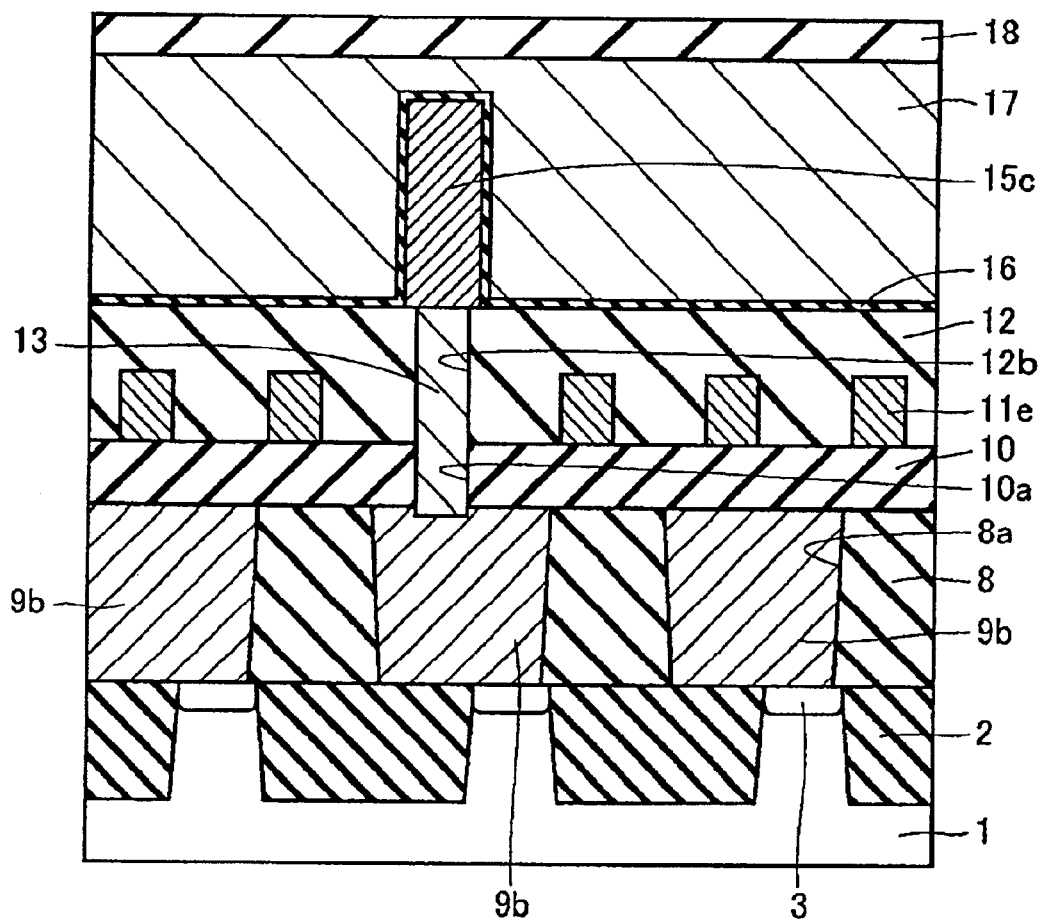
FIG. 22 is a schematic sectional view showing a structure of the semiconductor device in a fifth embodiment of the present invention in correspondence with the sectional view taken on line XI—XI of FIG. 7.

Referring to FIG. 18, a structure of the embodiment is different from the structure of the second embodiment by comparison therewith in that storage nodes 15 in the memory cell area each have a stacking structure all of which has an almost uniform thickness. Hence, the stacking structure is also given to each of lead interconnection layers 15a and 15c formed from the same layer as is storage nodes 15 as shown in FIGS. 20 to 23.

Note that a structure other than as described above is almost the same as the corresponding structure of the first embodiment, so the same symbols are attached to the same constituents and description thereof is omitted.

(Sixth Embodiment)

Figure 23:
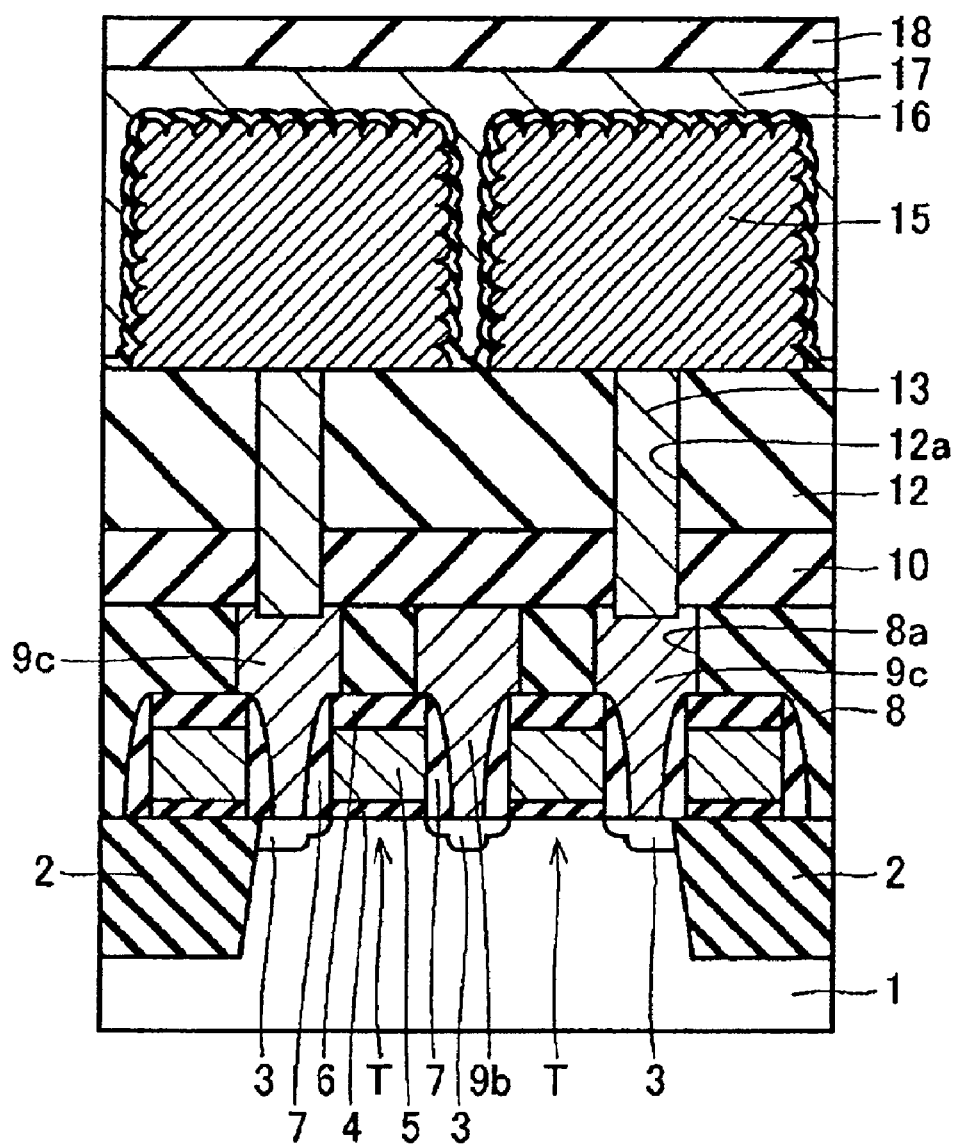
FIG. 23 is a schematic sectional view showing a structure of a semiconductor device in a sixth embodiment of the present invention in correspondence with the sectional view taken on line II—II of FIG. 7.
Figure 24:
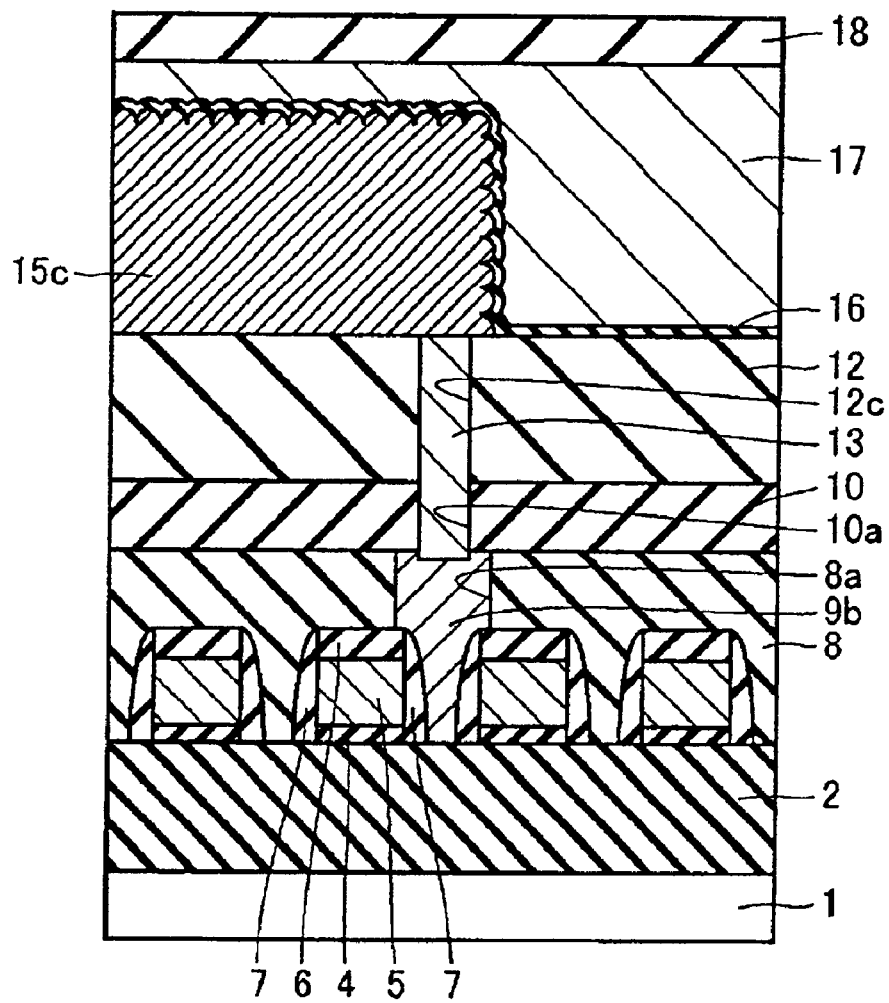
FIG. 24 is a schematic sectional view showing a structure of the semiconductor device in a sixth embodiment of the present invention in correspondence with the sectional view taken on line VIII—VIII of FIG. 7.
Figure 25:
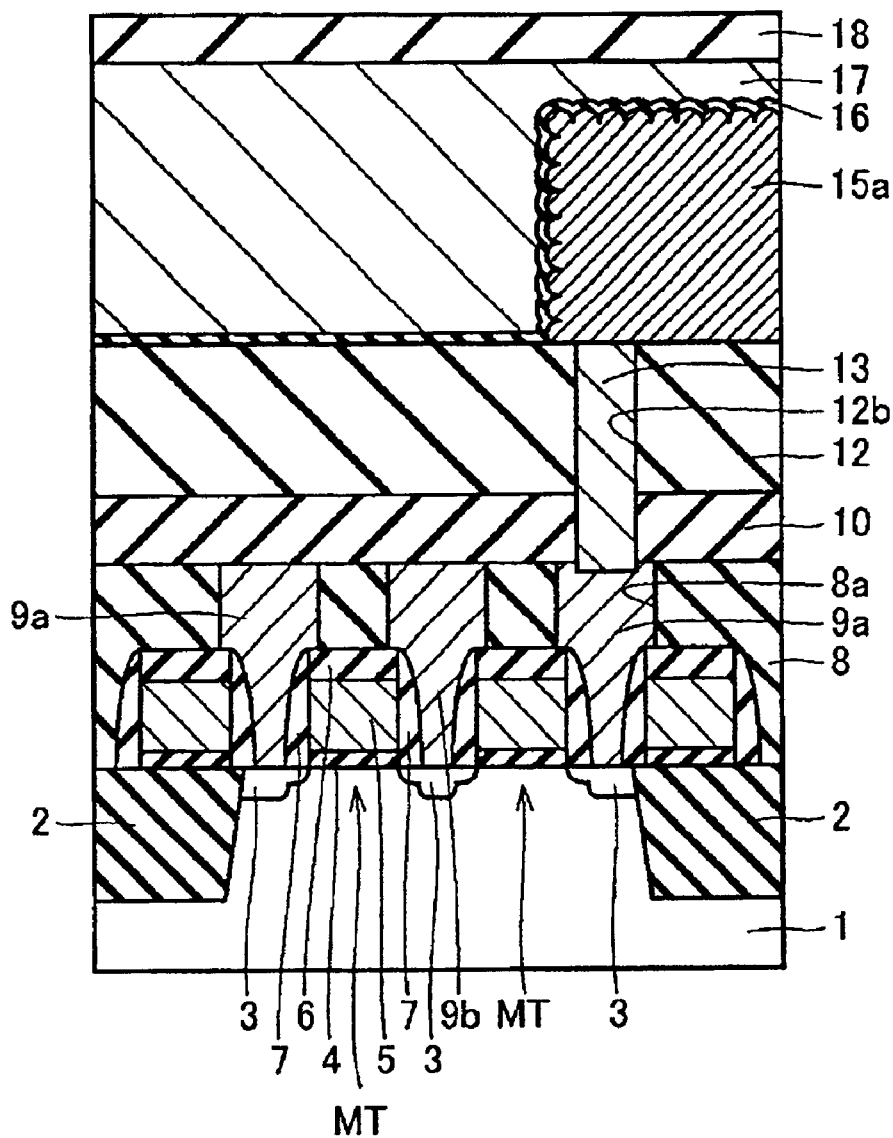
FIG. 25 is a schematic sectional view showing a structure of the semiconductor device in a sixth embodiment of the present invention in correspondence with the sectional view taken on line IX—IX of FIG. 7.
Figure 26:
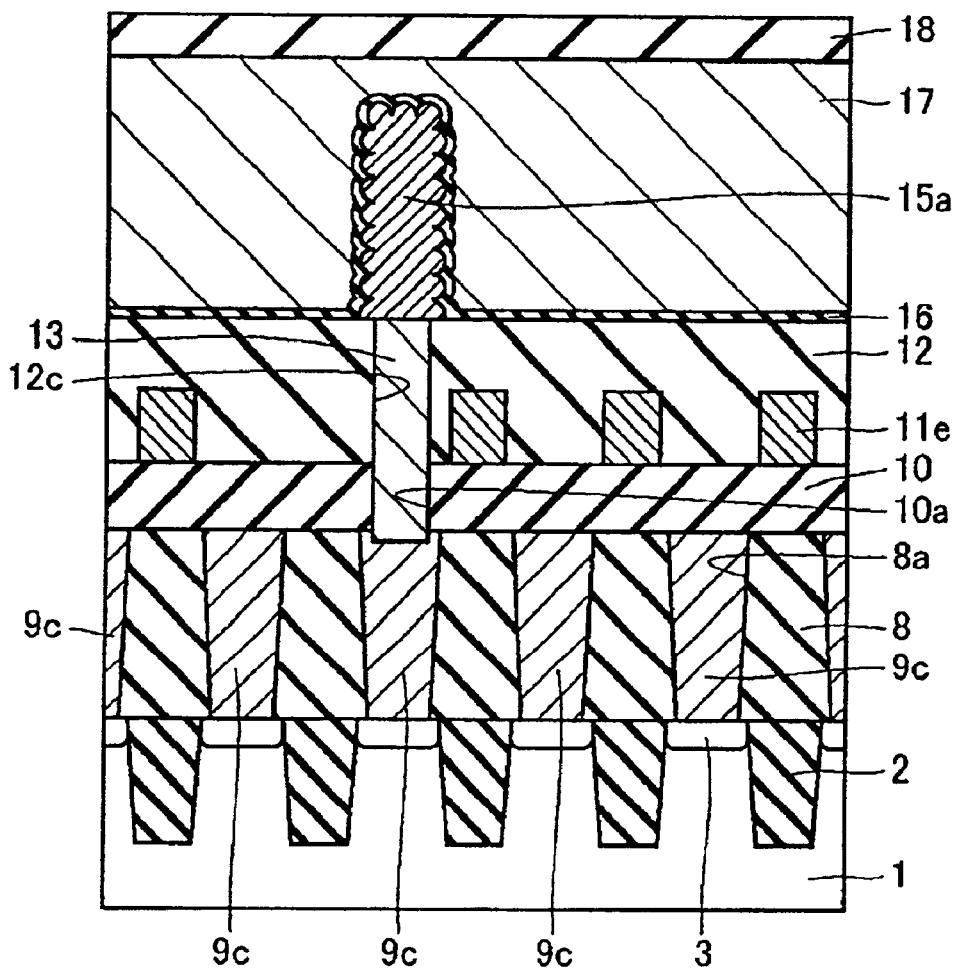
FIG. 26 is a schematic sectional view showing a structure of the semiconductor device in a sixth embodiment of the present invention in correspondence with the sectional view taken on line X—X of FIG. 7.
Figure 27:
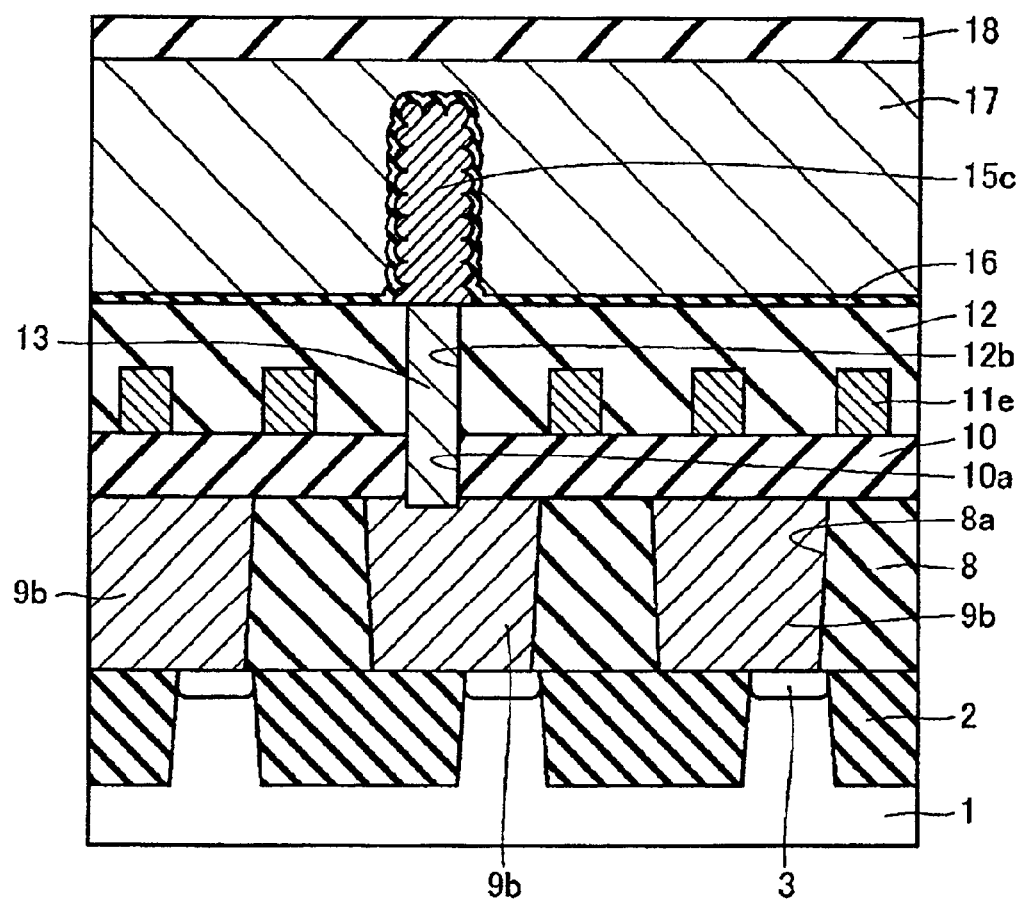
FIG. 27 is a schematic sectional view showing a structure of the semiconductor device in a sixth embodiment of the present invention in correspondence with the sectional view taken on line XI—XI of FIG. 7.

Referring to FIG. 23, a structure of the embodiment is different from the structure of the first embodiment by comparison therewith in that storage nodes 15 in the memory cell area each have a stacking structure of polycrystalline silicon in the form of a thick film with a rough surface. That is, a storage node 15 has a stacking structure made from polycrystalline silicon, whose surface is roughened. Hence, the stacking structure of polycrystalline silicon in the form of a thick film with a rough surface is also given to each of lead interconnection layers 15a and 15c formed from the same layer as is storage node 15 as shown in FIGS. 24 to 27.

Note that a structure other than as described above is almost the same as the corresponding structure of the second embodiment, so the same symbols are attached to the same constituents and description thereof is omitted.

(Seventh Embodiment)

Figure 28:
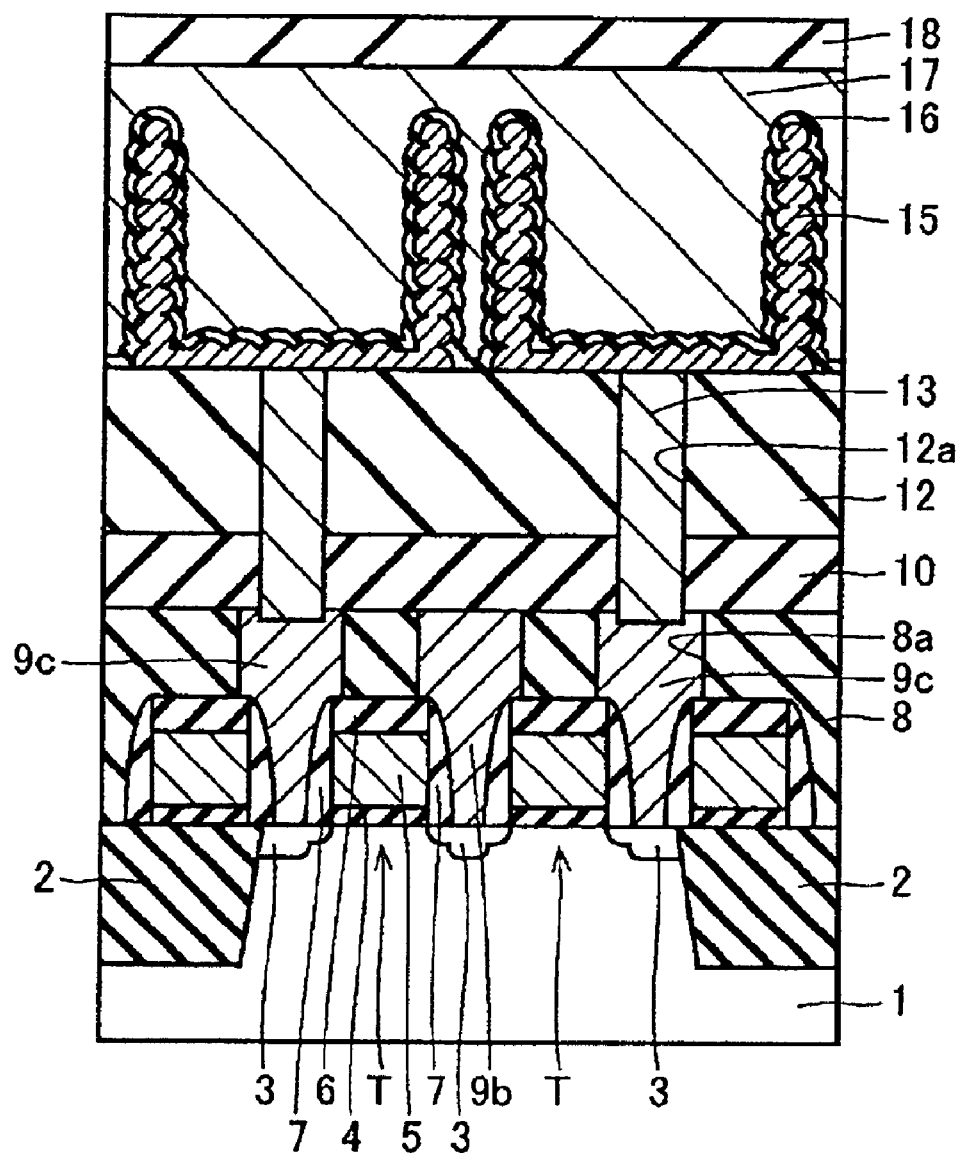
FIG. 28 is a schematic sectional view showing a structure of a semiconductor device in a seventh embodiment of the present invention in correspondence with the sectional view taken on line II—II of FIG. 7.
Figure 29:
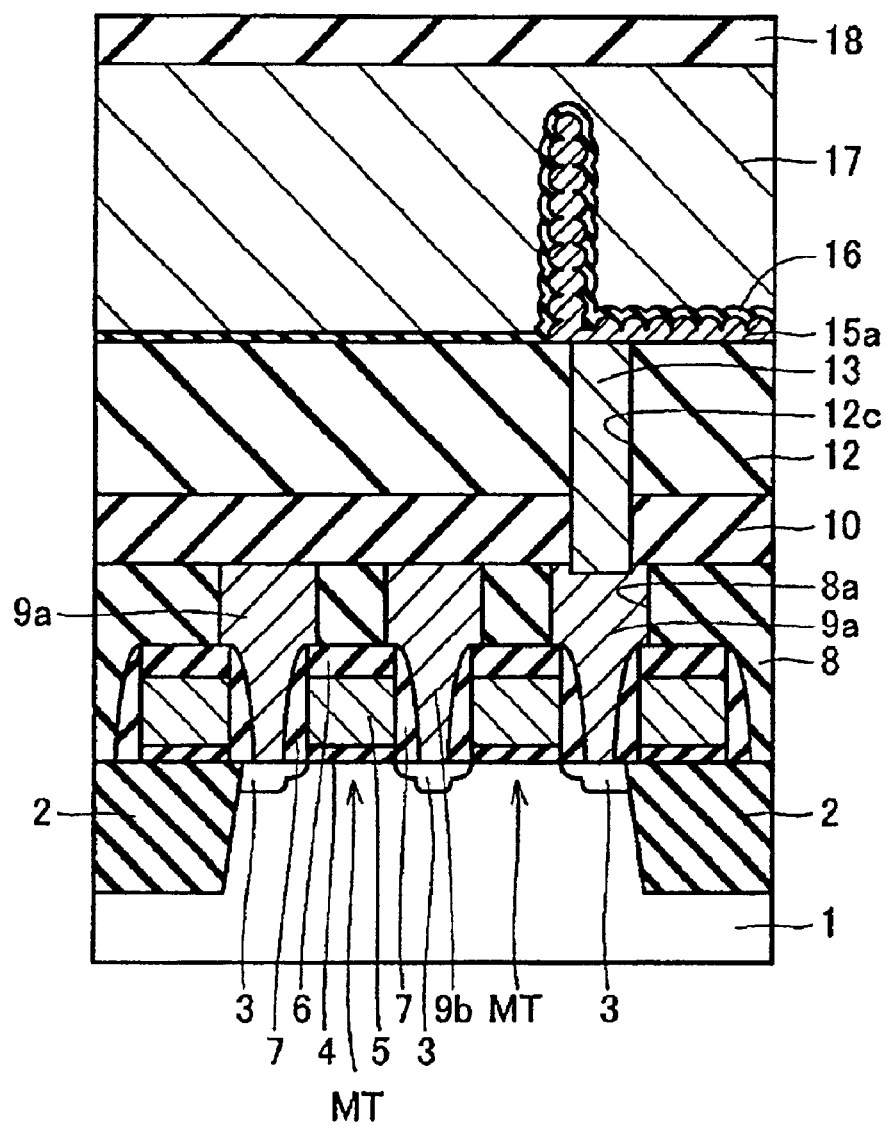
FIG. 29 is a schematic sectional view showing a structure of the semiconductor device in a seventh embodiment of the present invention in correspondence with the sectional view taken on line VIII—VIII of FIG. 7.
Figure 30:
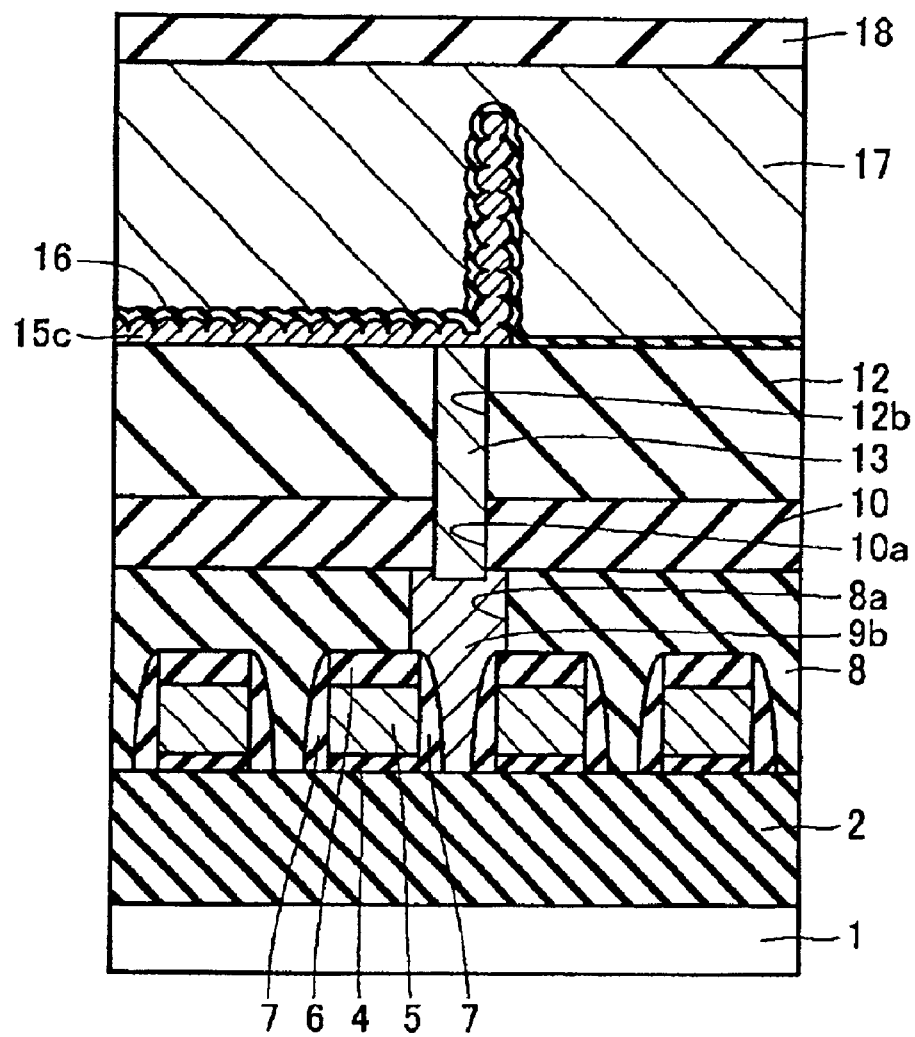
FIG. 30 is a schematic sectional view showing a structure of the semiconductor device in a seventh embodiment of the present invention in correspondence with the sectional view taken on line IX—IX of FIG. 7.
Figure 31:
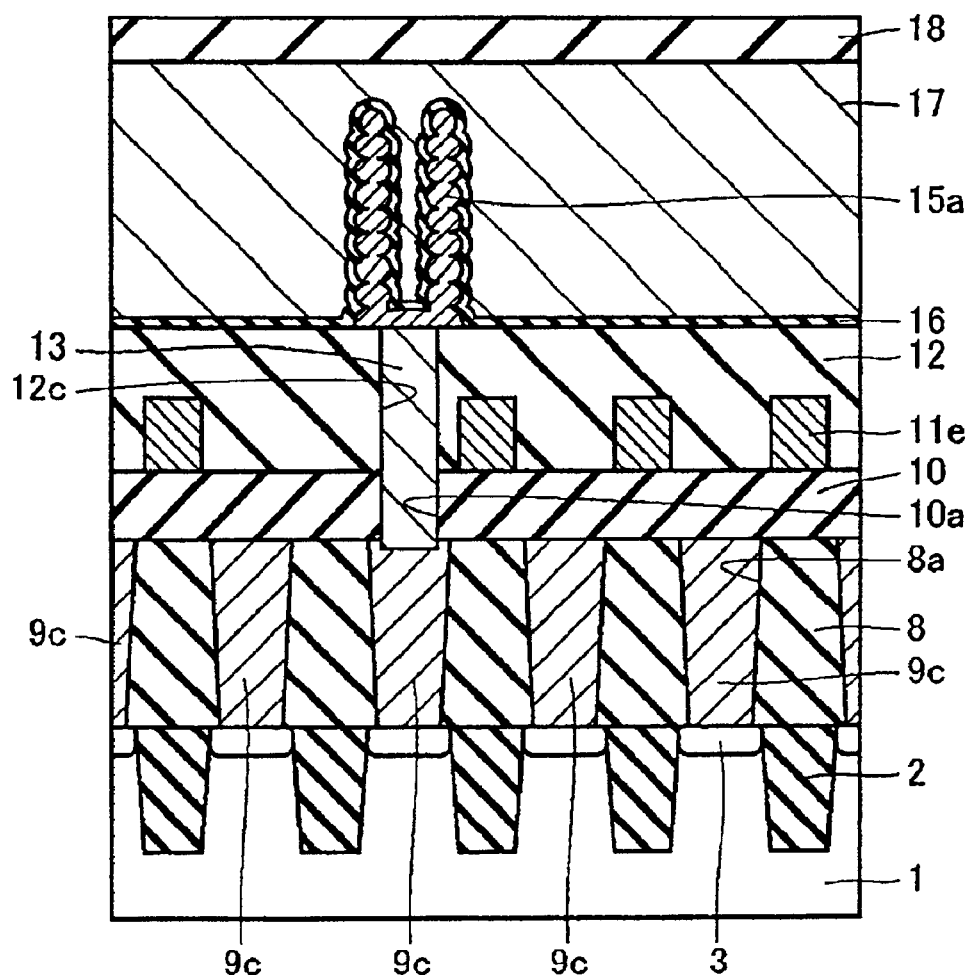
FIG. 31 is a schematic sectional view showing a structure of the semiconductor device in a seventh embodiment of the present invention in correspondence with the sectional view taken on line X—X of FIG. 7.
Figure 32:
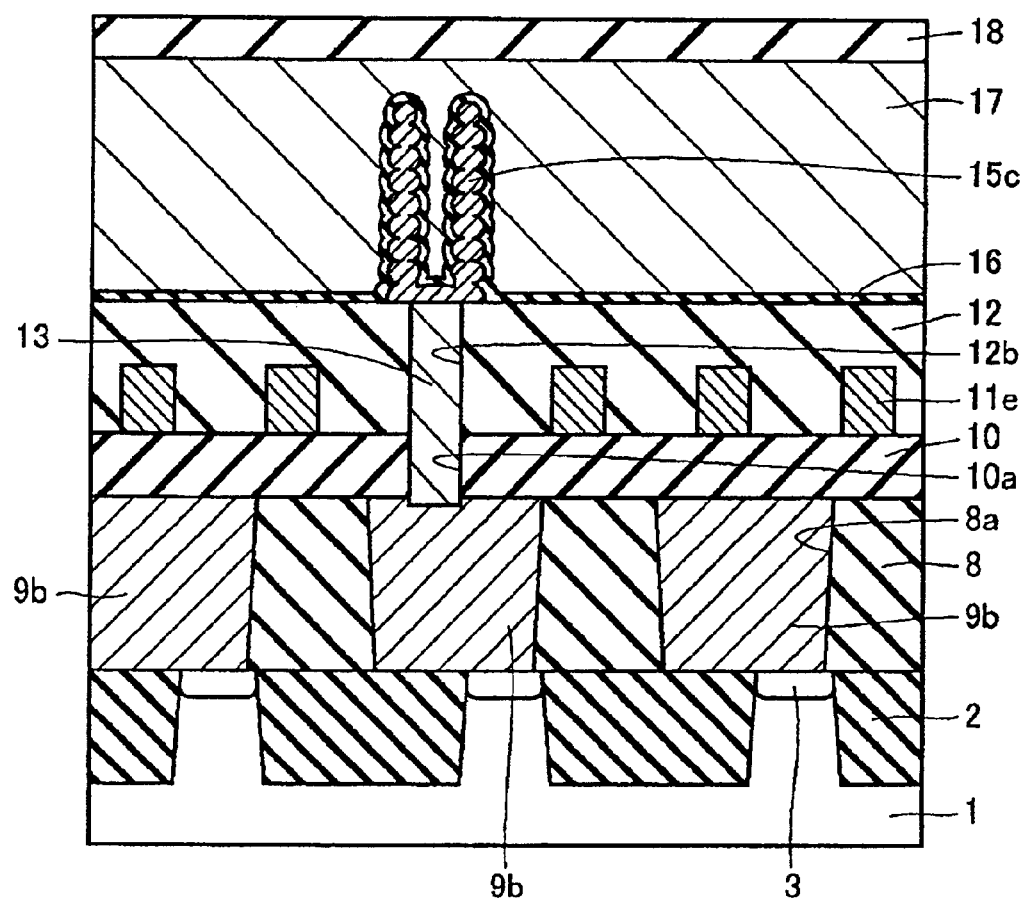
FIG. 32 is a schematic sectional view showing a structure of the semiconductor device in a seventh embodiment of the present invention in correspondence with the sectional view taken on line XI—XI of FIG. 7.

Referring to FIG. 28, a structure of the embodiment is different from the structure of the second embodiment by comparison therewith in that storage nodes 15 each have a structure in the shape of a hollow cylinder with a rough surface. That is, a storage node 15 has the shape of a hollow cylinder all the surface of which is rough. Thereby, such a structure as a hollow cylinder with a rough surface is also given to each of lead interconnection layers 11a and 11c formed from the same layer as is storage node 15, as shown in FIGS. 29 to 32.

Note that a structure other than as described above is almost the same as the corresponding structure of the second embodiment, so the same symbols are attached to the same constituents and description thereof is omitted.

(Eighth Embodiment)

Figure 33:
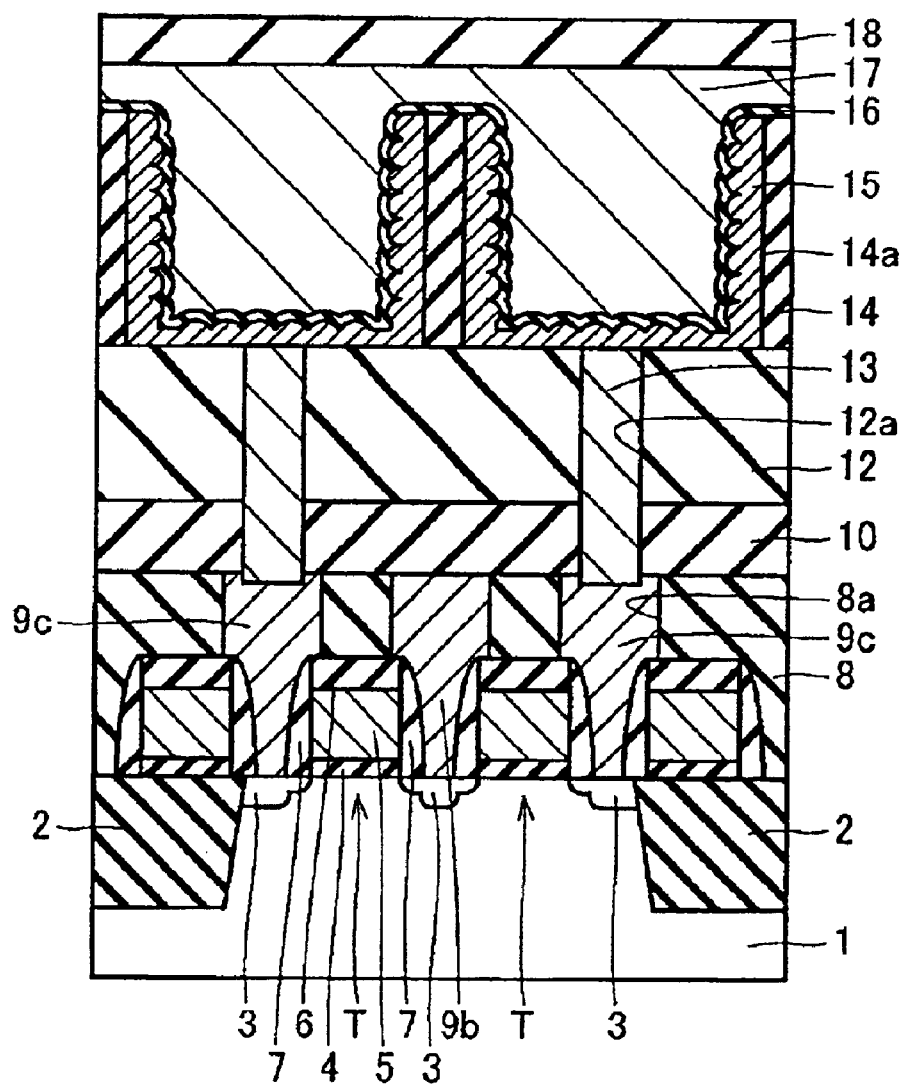
FIG. 33 is a schematic sectional view showing a structure of a semiconductor device in an eighth embodiment of the present invention in correspondence with the sectional view taken on line II—II of FIG. 7.
Figure 34:
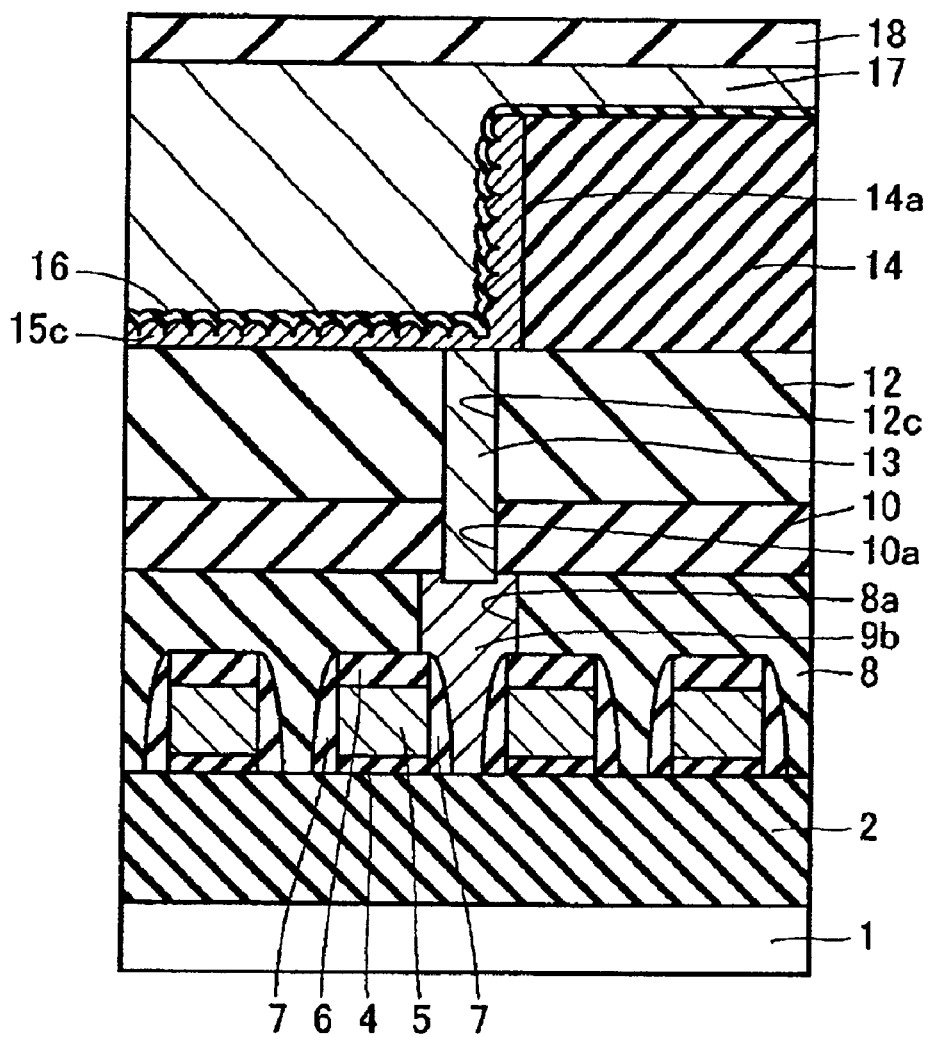
FIG. 34 is a schematic sectional view showing a structure of the semiconductor device in an eighth embodiment of the present invention in correspondence with the sectional view taken on line VIII—VIII of FIG. 7.
Figure 35:
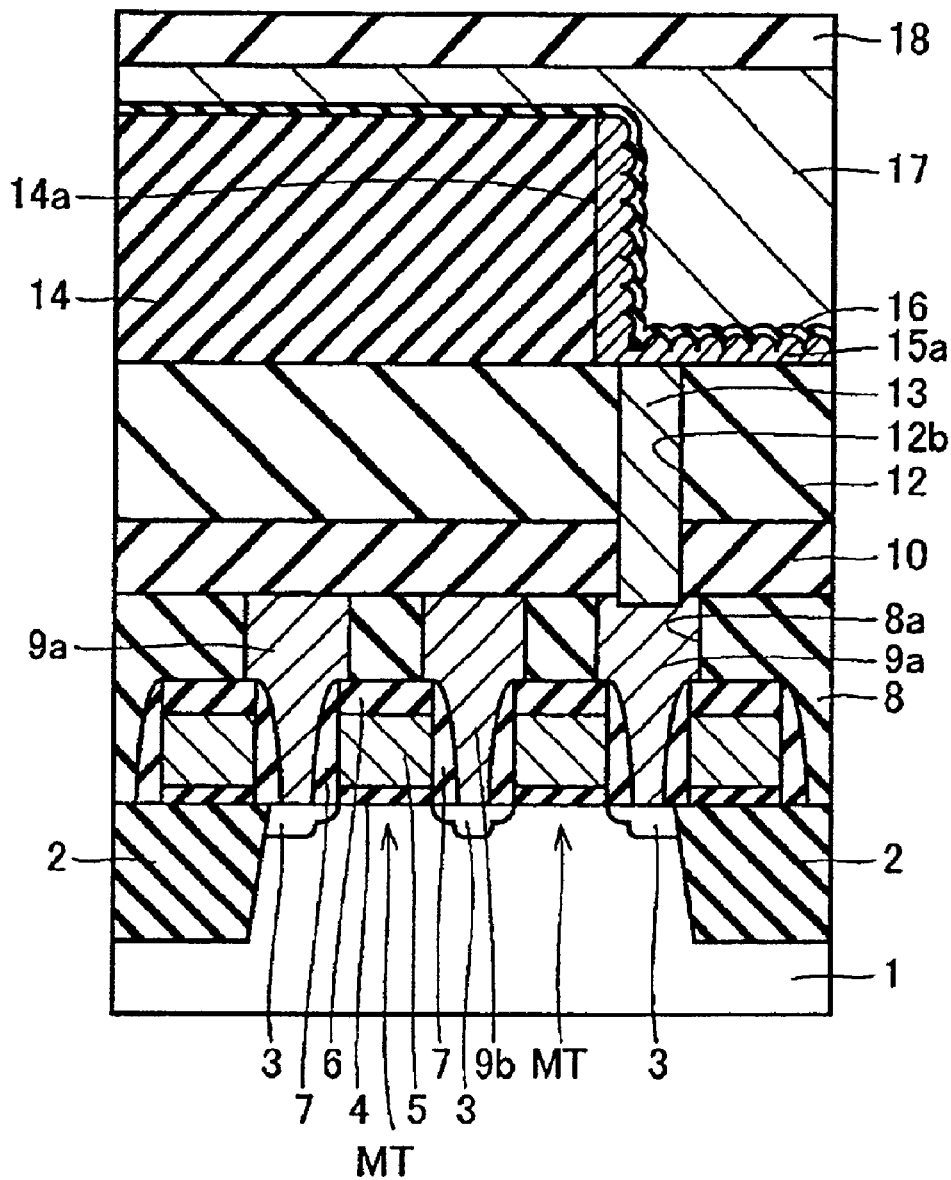
FIG. 35 is a schematic sectional view showing a structure of the semiconductor device in an eighth embodiment of the present invention in correspondence with the sectional view taken on line IX—IX of FIG. 7.
Figure 36:
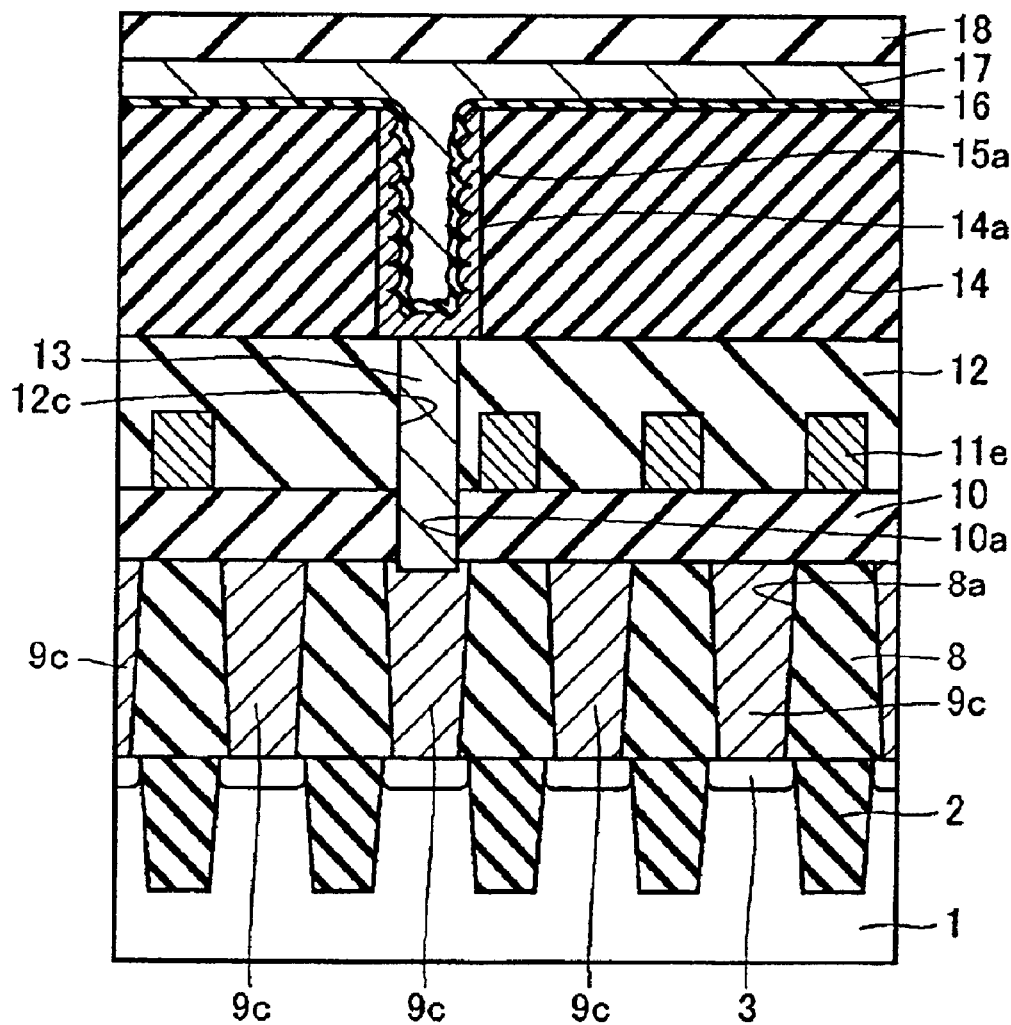
FIG. 36 is a schematic sectional view showing a structure of the semiconductor device in an eighth embodiment of the present invention in correspondence with the sectional view taken on line X—X of FIG. 7.
Figure 37:
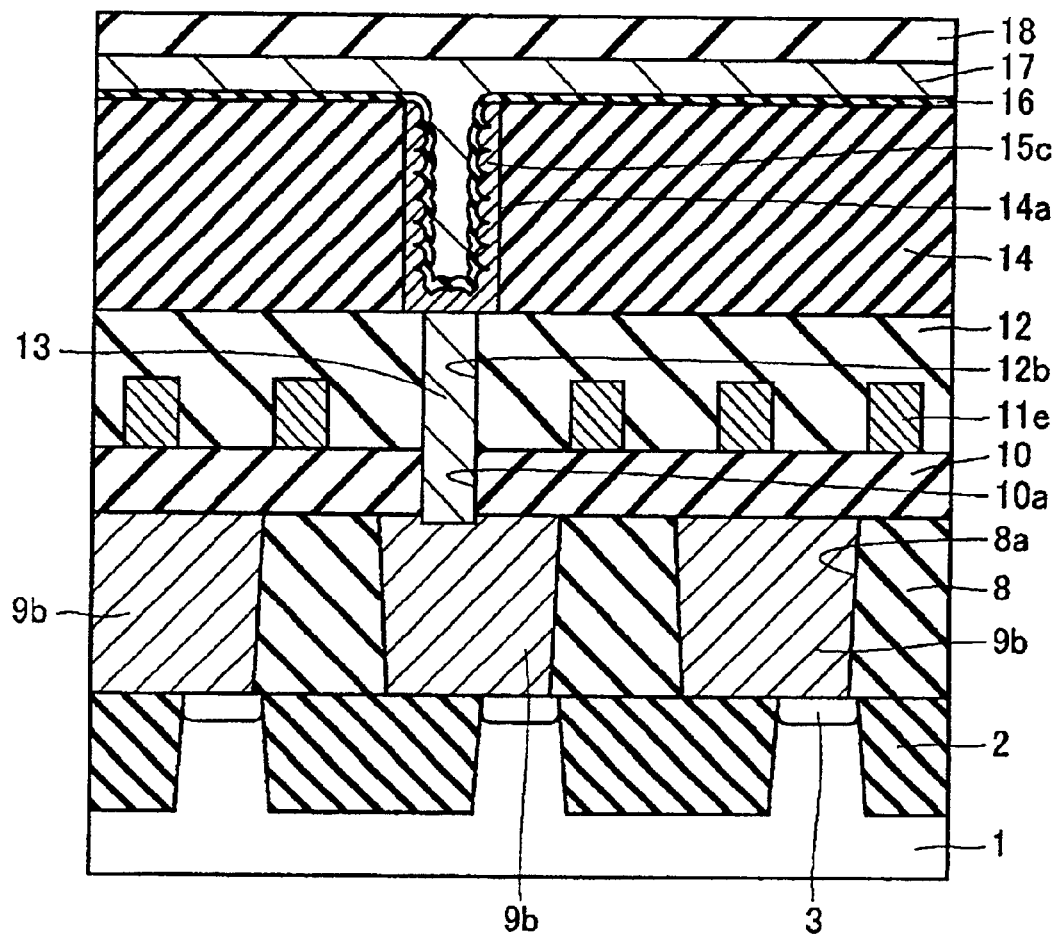
FIG. 37 is a sectional view showing a structure of the semiconductor device in an eighth embodiment of the present invention in correspondence with the sectional view taken on line XI—XI of FIG. 7.

Referring to FIG. 33, a structure of the embodiment is different from the structure of the second embodiment by comparison therewith in that storage nodes 15 each have a structure of a cylinder having a concave inner wall with an rough surface. That is, a storage node 15 has the shape of a cylinder formed inside a hole 14a provided in interlayer insulating layer 14, having a rough cylindrical inner surface and a rough bottom surface. Thereby, such a structure as of a cylinder having a concave inner wall with an rough surface is also given to each of lead interconnection layers 15a and 15c formed from the same layer as is storage node 15, as shown in FIGS. 34 to 37.

Note that a structure other than as described above is almost the same as the corresponding structure of the second embodiment, so the same symbols are attached to the same constituents and description thereof is omitted.

(Ninth Embodiment)

Figure 38:
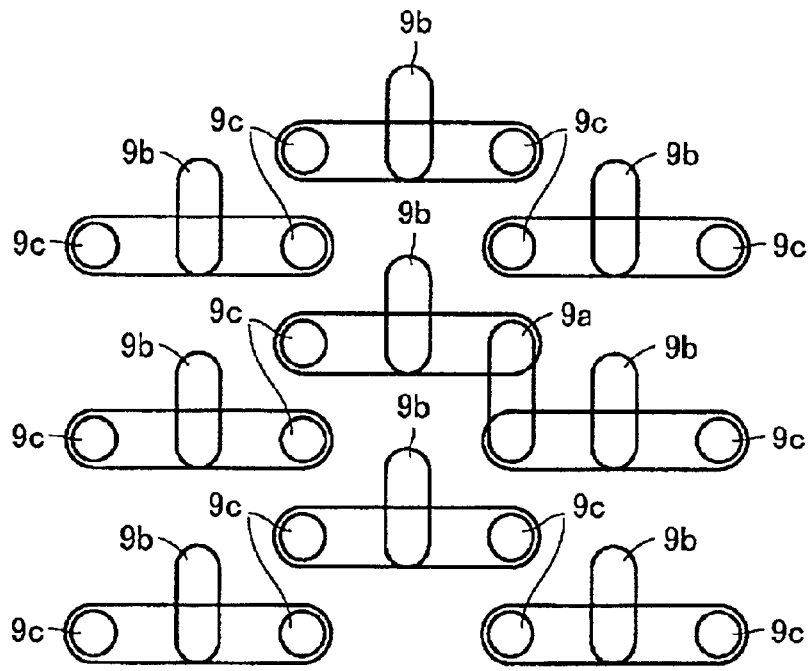
FIG. 38 is a plan view schematically showing a configuration of a semiconductor device in a ninth embodiment of the present invention.

Referring to FIG. 38, a landing pad layer 9a connected to source/drain region 3 of a monitor transistor MT is coupled to a landing pad layer 9a electrically connected to source/drain region 3 of another monitor transistor. Thereby, lead interconnection layer 11a can be connected to coupled landing pad layer 9a as shown in FIG. 1.

Figure 39:
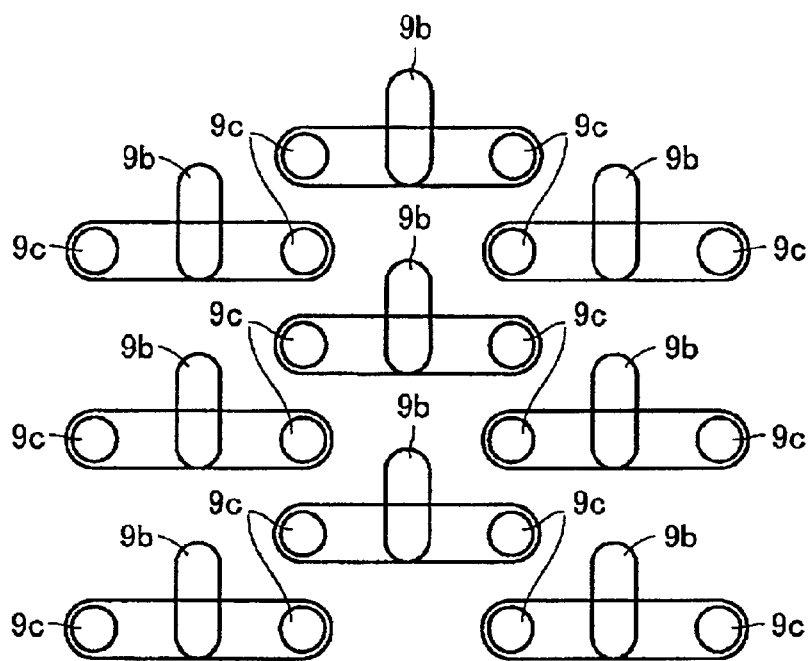
FIG. 39 is a plan view schematically showing a configuration of a prior art semiconductor device.

Note that in a prior art monitor area, landing pads 9c are not coupled to each other as shown in FIG. 39.

(Tenth Embodiment)

Figure 40:
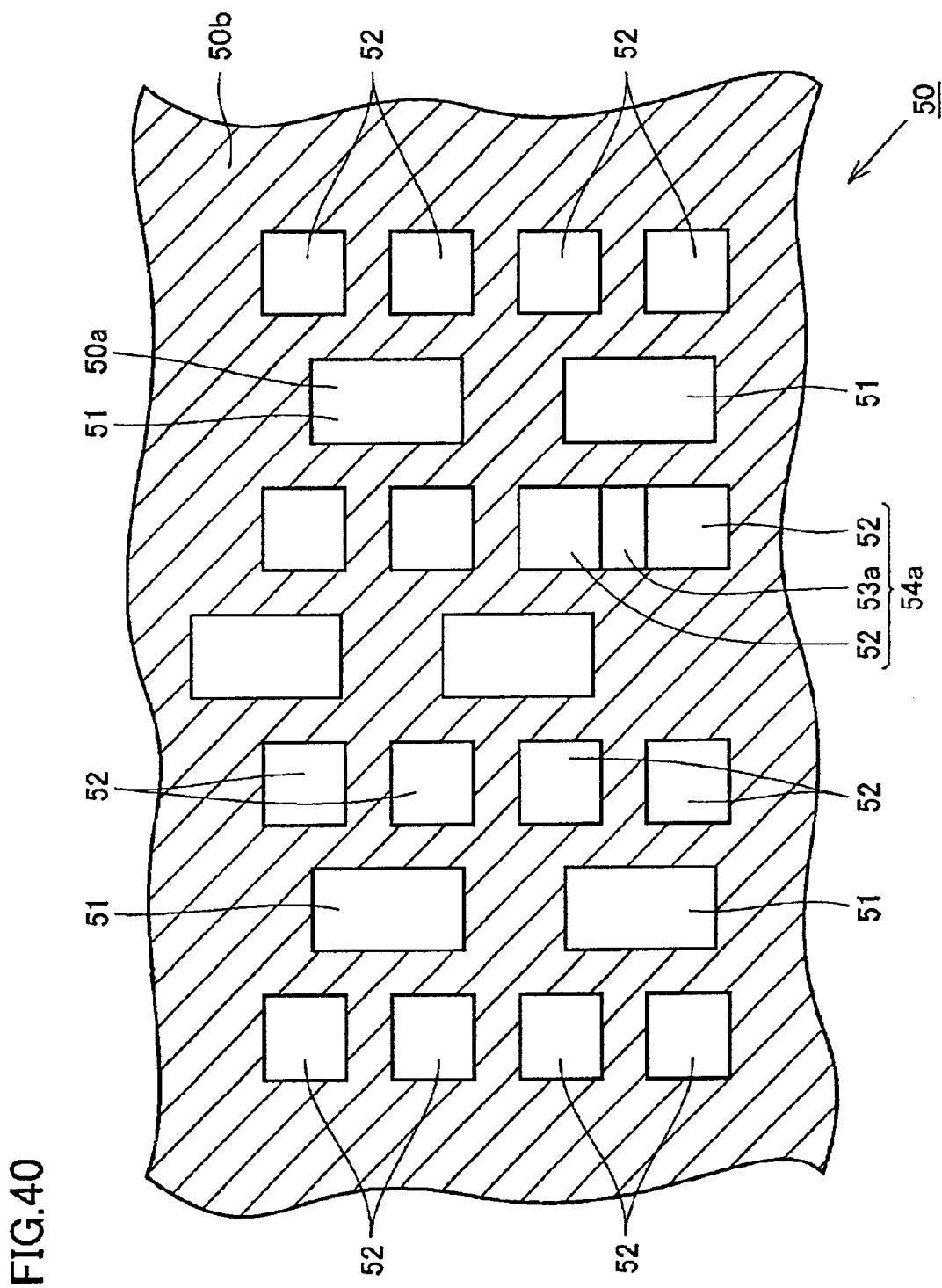
FIG. 40 is a plan view showing a structure of a photomask for forming pads used in fabrication of a semiconductor device in a tenth embodiment of the present invention.

Referring to FIG. 40, a photomask is used in patterning when pad layers 9a, 9b and 9c, which are shown in FIG. 38, are formed. The photomask has a structure in which a light shielding film 50b having opening patterns 51, 52 and 54a are formed on a transparent substrate 50a.

Pattern 51 of the photomask corresponds to pad layer 9b of FIG. 38, pattern 52 thereof corresponds to pad layer 9c of FIG. 38 and pattern 54a thereof corresponds to coupled landing pad layer 9a of FIG. 38. Each feature of pattern 54a is constituted of features of pattern 52 at the both ends thereof and a feature of coupling pattern 53a coupled therebetween. Features of pattern 52 correspond to regions connected to source/drain regions 3 of a monitor transistor MT and a feature of coupling pattern 53a corresponds to a region connected between the two features of pattern 52. Pattern 52 and coupling pattern 53a have the same width of a feature.

After a conductive layer serving as a pad layer is formed over all of the surface, a negative photoresist is applied on the conductive layer, the photoresist is exposed to light using a photomask for forming pads, the photoresist after the exposure is developed to attain a resist pattern and then etching is performed on the conductive layer using the resist pattern as a mask to form pads.

Note that while in the above description, a case where a negative photoresist is employed is taken up, a positive photoresist may be employed instead. In a latter case, there is employed a photomask on which a light shield pattern and an opening pattern are obtained by inverting the opening pattern and the light shield pattern on the photomask for the negative photoresist, respectively.

In the embodiment, since two features of source/drain connection pattern 52 is coupled by a feature of coupling pattern 53a as described above, coupled landing pad layer 9a, as shown in FIG. 38, can be formed.

Figure 41:
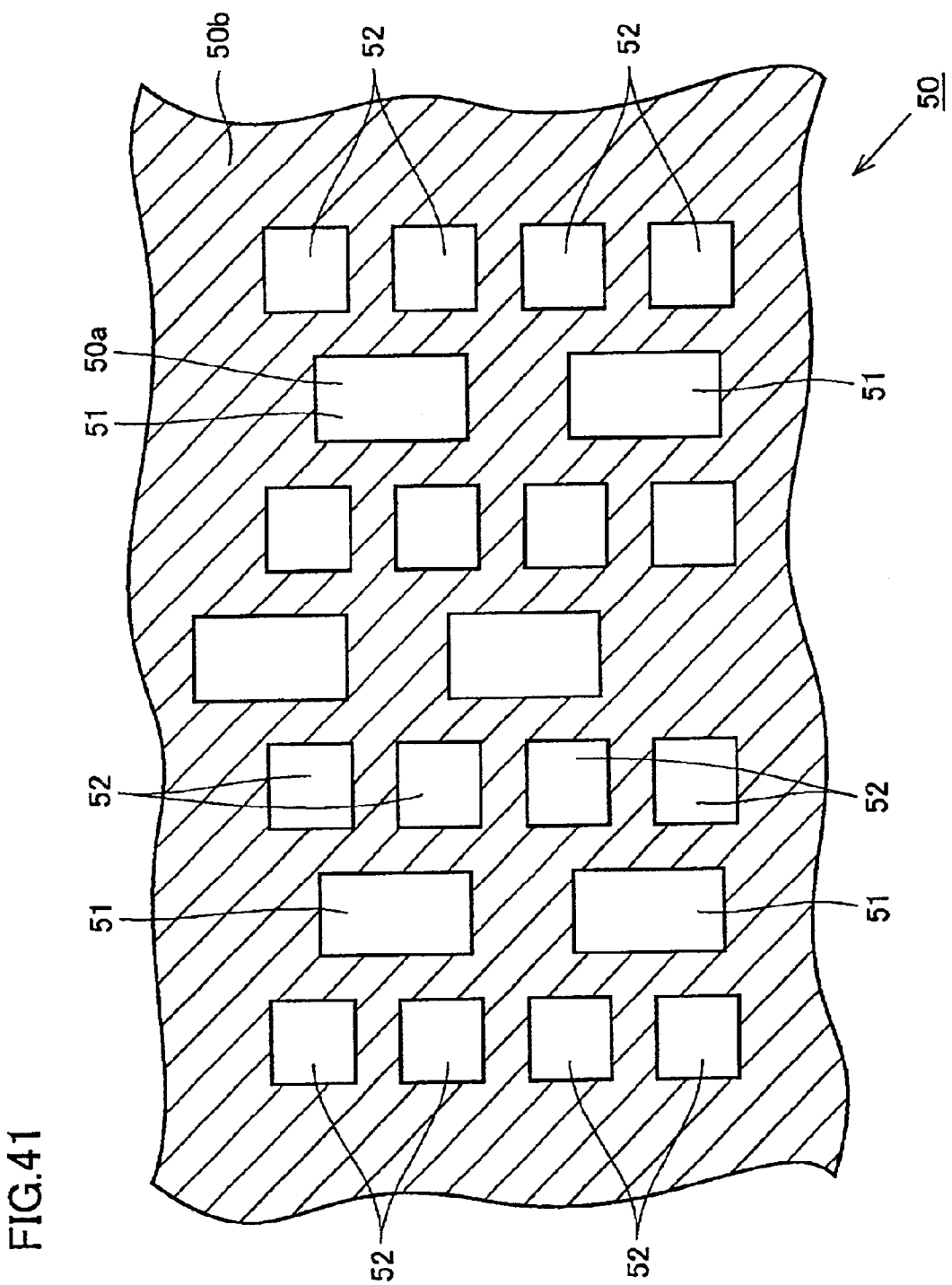
FIG. 41 is a plan view showing a structure of a photomask for forming pads used in fabrication of a prior art semiconductor device.

Note that since, in a prior art practice, no coupled landing pad layer 9a is formed, a photomask for forming pads has an opening patterns 51 and 52 as shown in FIG. 41.

(Eleventh Embodiment)

A structure of a photomask of the embodiment is different from the structure of the photomask of the tenth embodiment shown in FIG. 40 by comparison therewith in a relationship in feature width between coupling pattern 53b and pattern 52. In the embodiment, a width a of a feature of coupling pattern 53b is set smaller than a width b of a feature of pattern 52.

Note that since the other part of the structure is almost the same as that of the structure of the photomask of the tenth embodiment, the same symbols are attached to the same constituents and description thereof is omitted.

With such a dimensional adjustment between pattern features adopted, a process margin for photolithography is improved against coupling of a feature of pattern 54b with a feature of pattern 51 adjacent thereto.

(Twelfth Embodiment)

Figure 42:
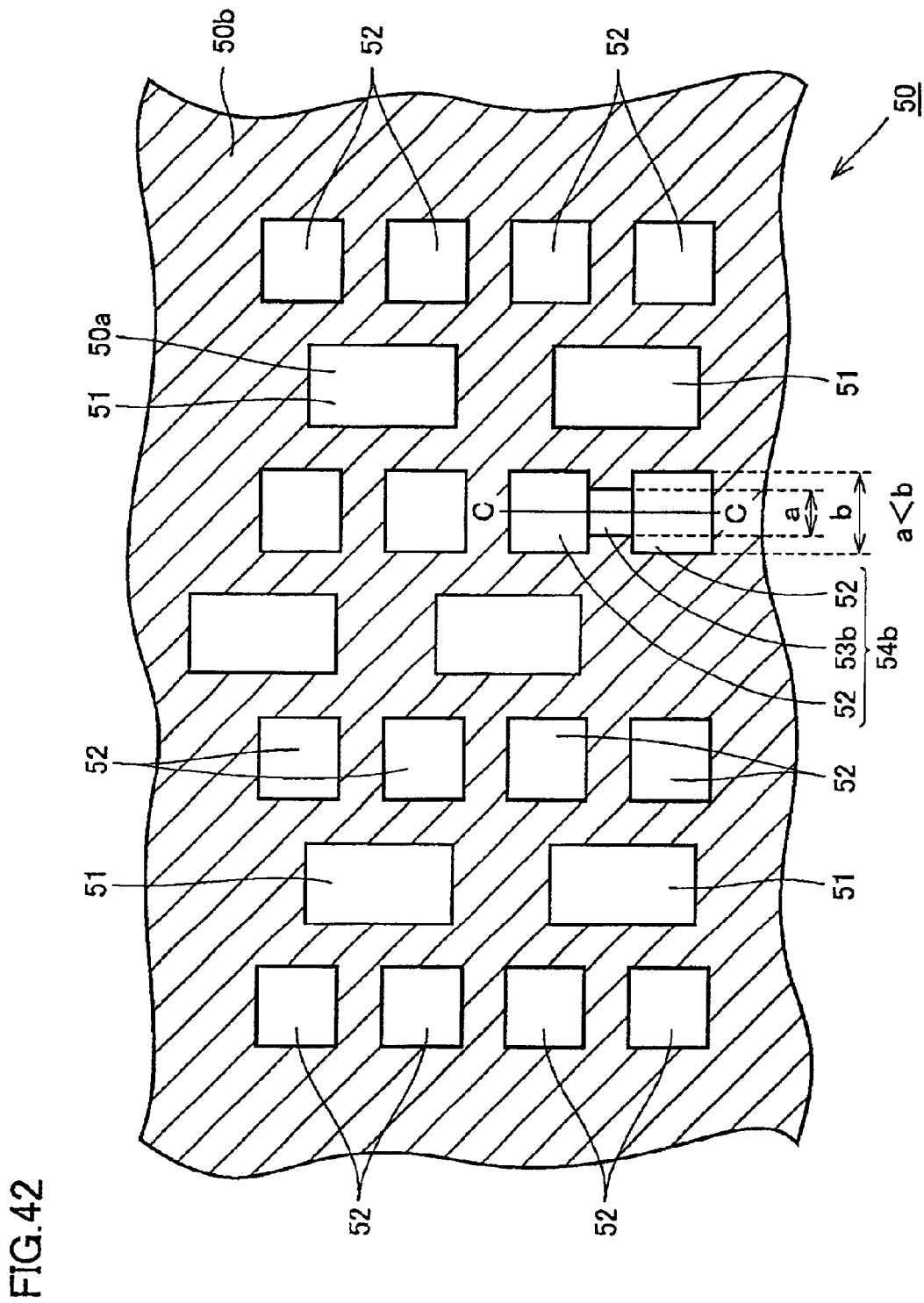
FIG. 42 is a plan view showing a structure of a photomask for forming pads used in fabrication of a semiconductor device in an eleventh embodiment of the present invention.
Figure 43:
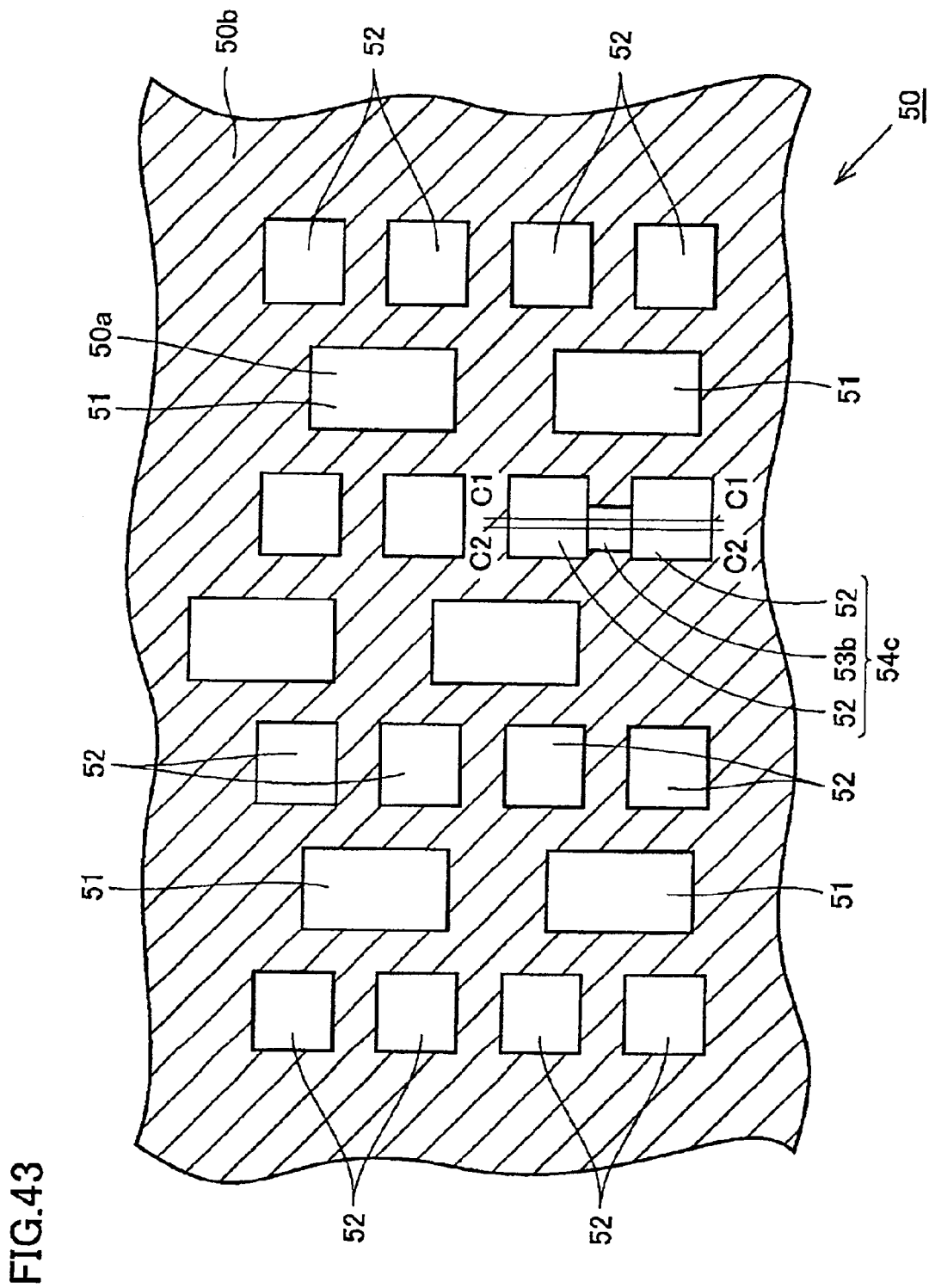
FIG. 43 is a plan view showing a structure of a photomask for forming pads used in fabrication of a semiconductor device in a twelfth embodiment of the present invention.

Referring to FIG. 43, a structure of the embodiment is different from the structure of the eleventh embodiment shown in FIG. 42 by comparison therewith in that a placement location of a feature of coupling pattern 53b is shifted from an imaginary line (a line C1—C1) passing through the centers of adjacent features of pattern 52. In the embodiment, a center line (a line C2—C2) of a feature of coupling pattern 53b is shifted from the imaginary line (line C1—C1) connecting the centers of the two adjacent features of pattern 52 to the left as viewed in front of the figure with the imaginary line positioned vertically.

Note that since the other part of the structure is almost the same as that of the structure of the photomask of the eleventh embodiment, the same symbols are attached to the same constituents and description thereof is omitted.

In the embodiment, since a feature width of coupling pattern 53b is smaller than that of pattern 52 and at the same time, the center of the feature of coupling pattern 53b is shifted to the left from the imaginary line connecting the centers of the two adjacent features of pattern 52, a process margin for photolithography can be further improved against coupling of the composite feature of pattern 54b with a feature of pattern 51 placed to the right therefrom.

(Thirteenth Embodiment)

Figure 44:
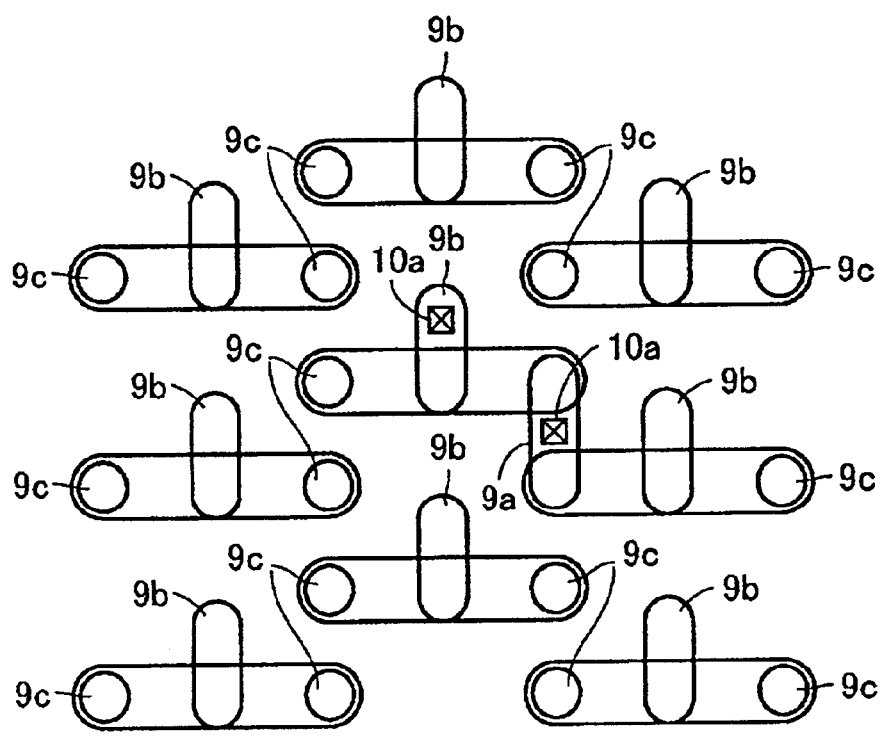
FIG. 44 is a plan view schematically showing a configuration of a semiconductor device in a thirteenth embodiment of the present invention.

Referring to FIG. 44, there is formed a hole 10a for connecting lead interconnection layer 11a and coupled landing pad layer 9a with each other in the middle section of the top surface of coupled landing pad layer 9a.

(Fourteenth Embodiment)

Figure 45:
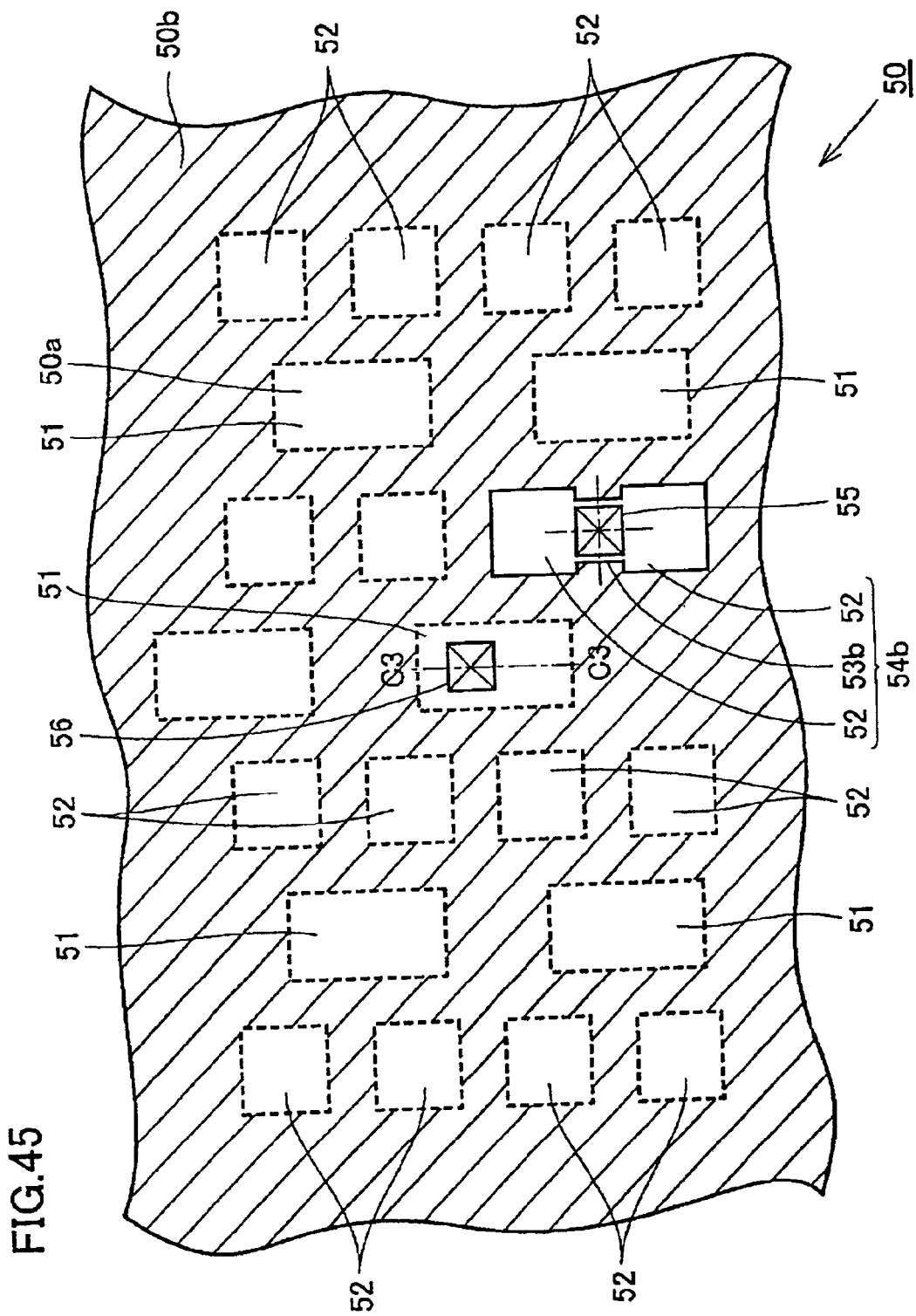
FIG. 45 is a plan view showing a relationship in placement of patterns between a photomask for forming pads and a hole photomask used in fabrication of a semiconductor device in a fourteenth embodiment of the present invention.

Referring to FIG. 45, pattern placement is performed so as to cause the center of a feature of pattern 54b for coupled landing pad layer 9a and the center of a feature of hole pattern 55 to coincide with each other. Furthermore, pattern placement is performed so as to cause the center of a feature of pattern 56 for a hole 10*a* used in connecting lead interconnection layer 11*c* and landing pad layer 9*b* with each other to locate on a center line (a line C3—C3) of a feature of pattern 51.

With such a pattern placement, there can be formed a hole 10*a* reaching the middle section of the top surface of coupled landing pad 9*a,* as shown in FIG. 44.

(Fifteenth Embodiment)

Figure 46:
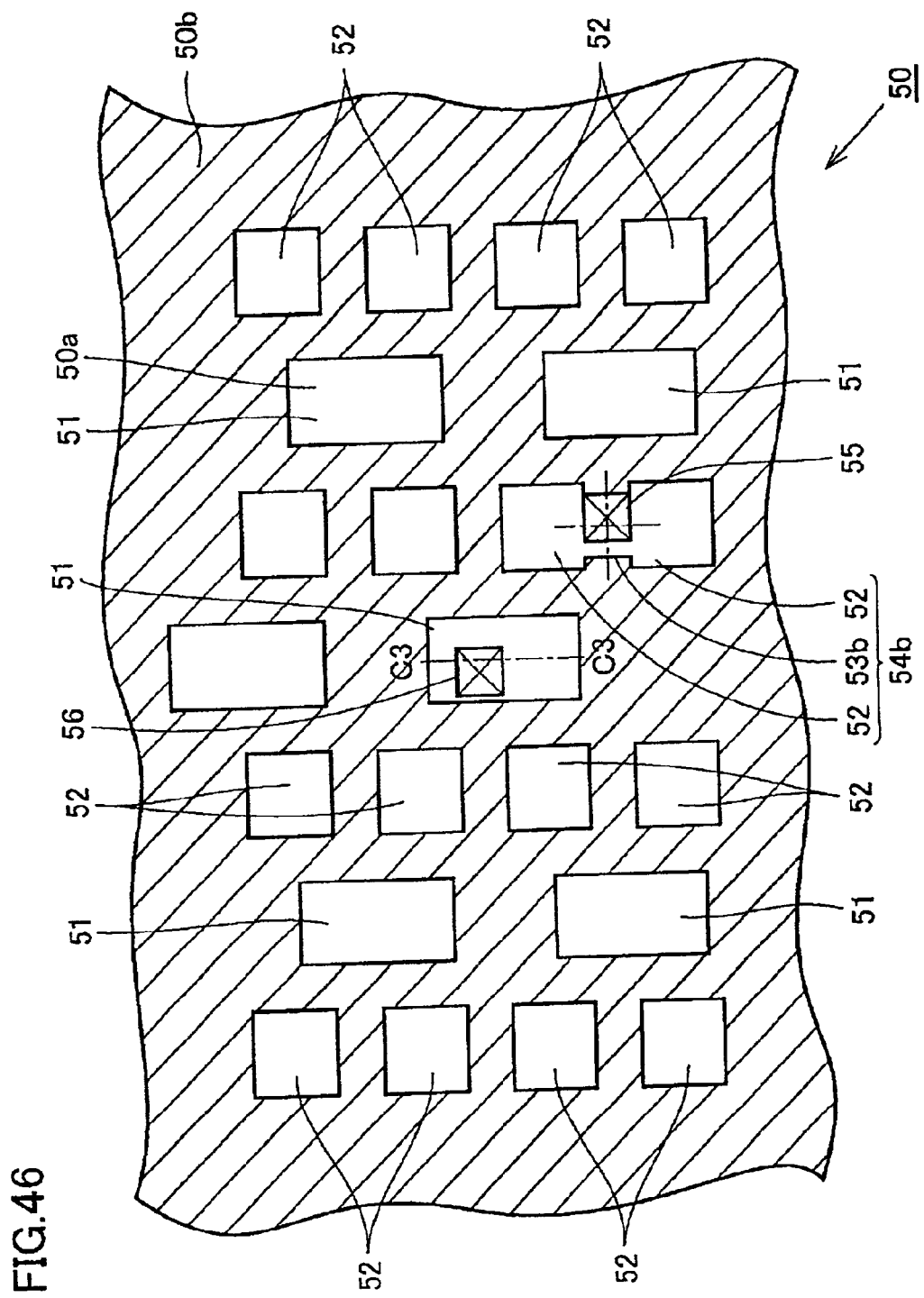
FIG. 46 is a plan view showing a relationship in placement of patterns between a photomask for forming pads and a hole photomask used in fabrication of a semiconductor device in a fifteenth embodiment of the present invention.

Referring to FIG. 46, in the embodiment, the center of a feature of hole pattern 55 is located at a position shifted to the right from a center line of a composite feature of pattern 54*b* for coupled landing pad layer 9*a* as viewed in front of the figure with the center line of the composite feature of pattern 54*b* positioned vertically. Furthermore, the center line of a feature of hole pattern 56 is shifted to the left from the center line (a line C3—C3) of a feature of pattern 51 for landing pad layer 9*b.*

In such a way, features of hole patterns 55 and 56 are shifted toward opposite directions along which the features of hole patterns 55 and 56 become more spaced apart from each other. For this reason, a hole formed by hole pattern 55 and a hole formed by hole pattern 56 can be prevented from being coupled with each other by an optical proximity effect.

Note that necessity arise for a shift of a feature of hole pattern 55 with respect to a corresponding feature of pattern 54*b* for coupled landing pad layer 9*a* and a shift of a feature of hole pattern 56 with respect to a corresponding feature of pattern 51 for landing pad layer 9*b* to be adjusted such that holes 10*a* and 10*b* do not protrude out from the peripheries of respective landing pad layers 9*a* and 9*b.*

(Sixteenth Embodiment)

Figure 47:
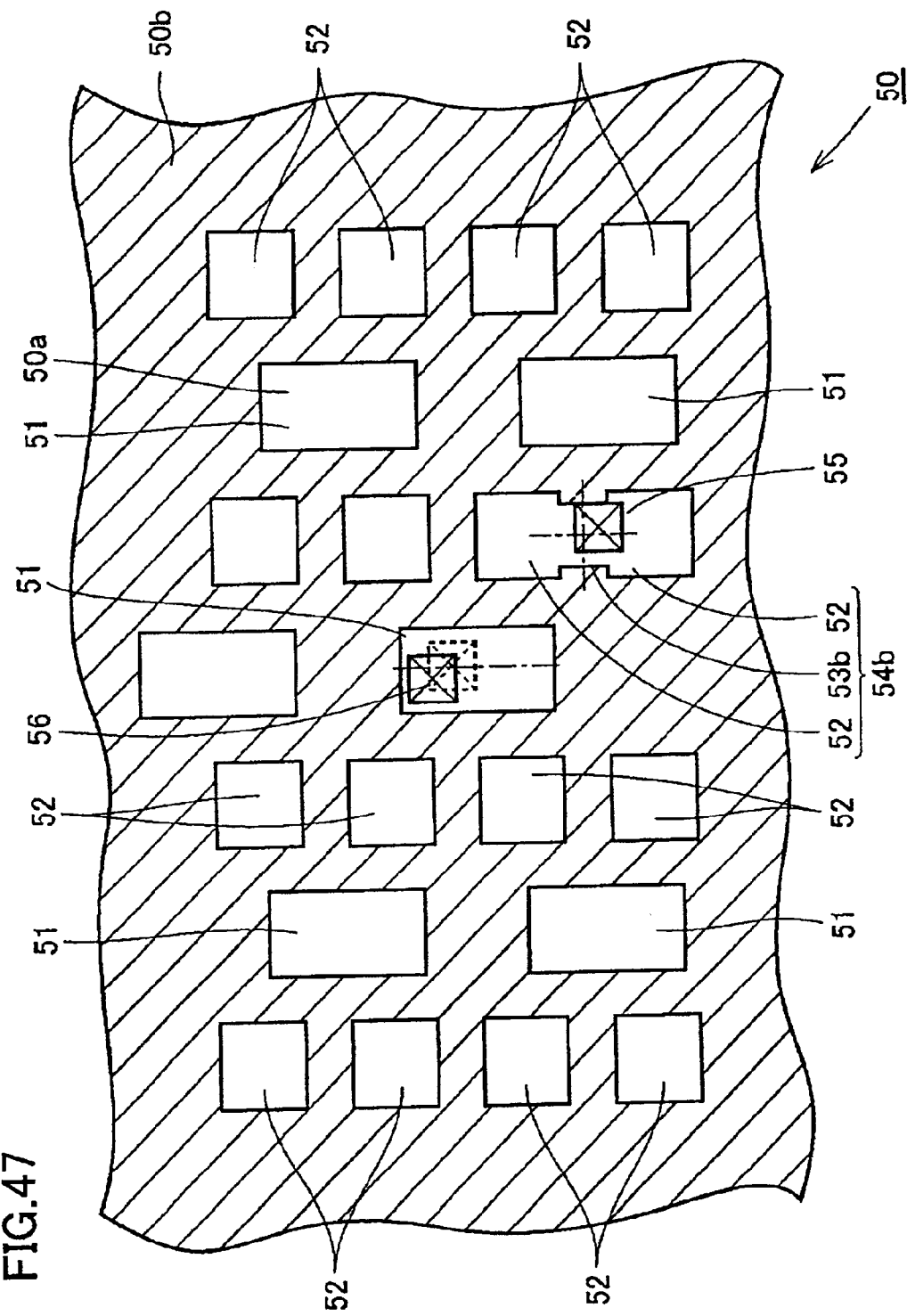
FIG. 47 is a plan view showing a relationship in placement of patterns between a photomask for forming pads and a hole photomask used in fabrication of a semiconductor device in a sixteenth embodiment of the present invention.
Figure 48:
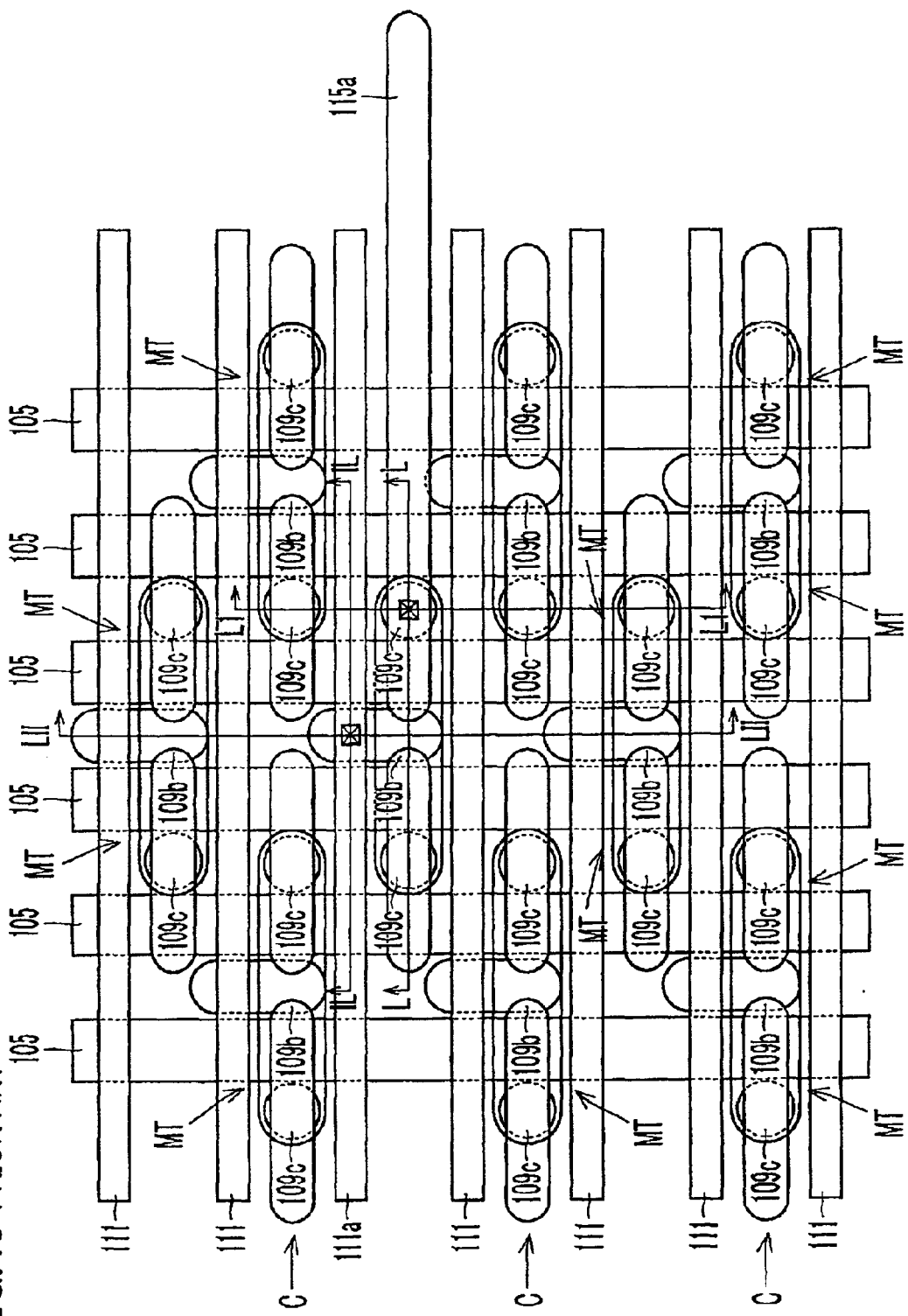
FIG. 48 is a plan view schematically showing a configuration of a prior art semiconductor device.
Figure 49:
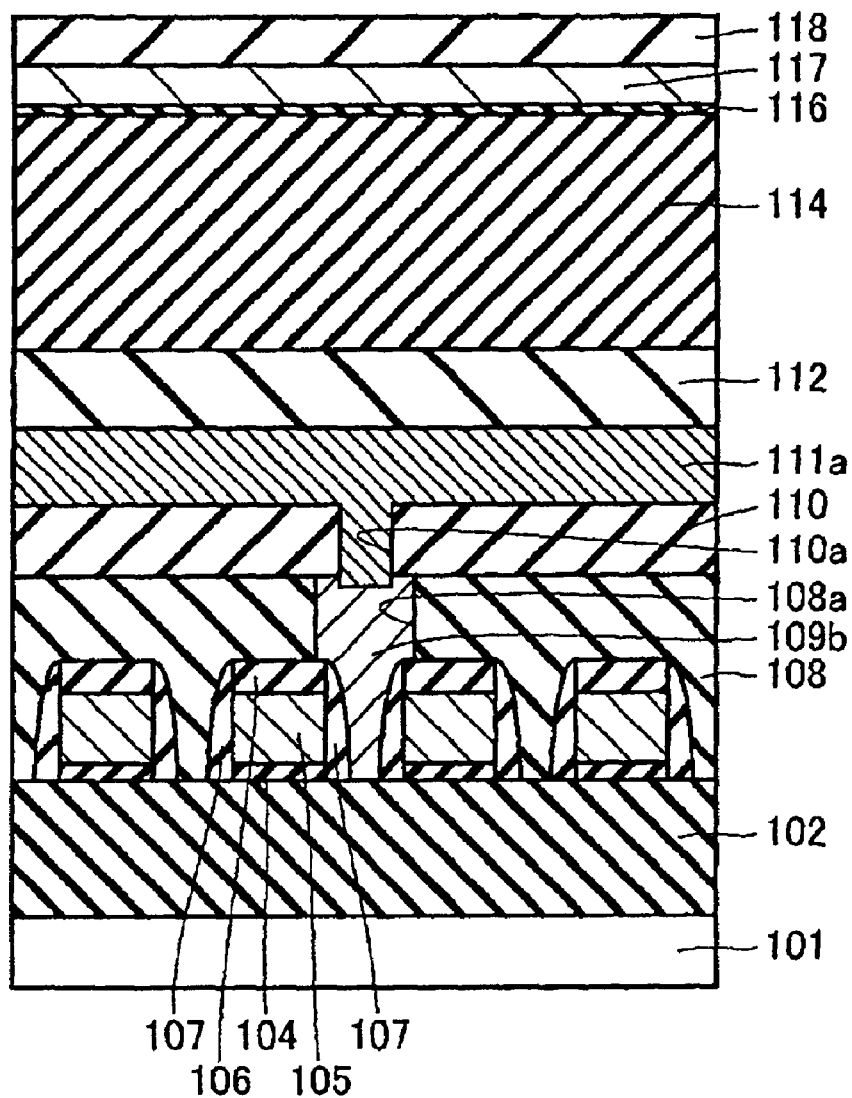
FIG. 49 is a schematic sectional view taken on line IL—IL of FIG. 48.
Figure 50:
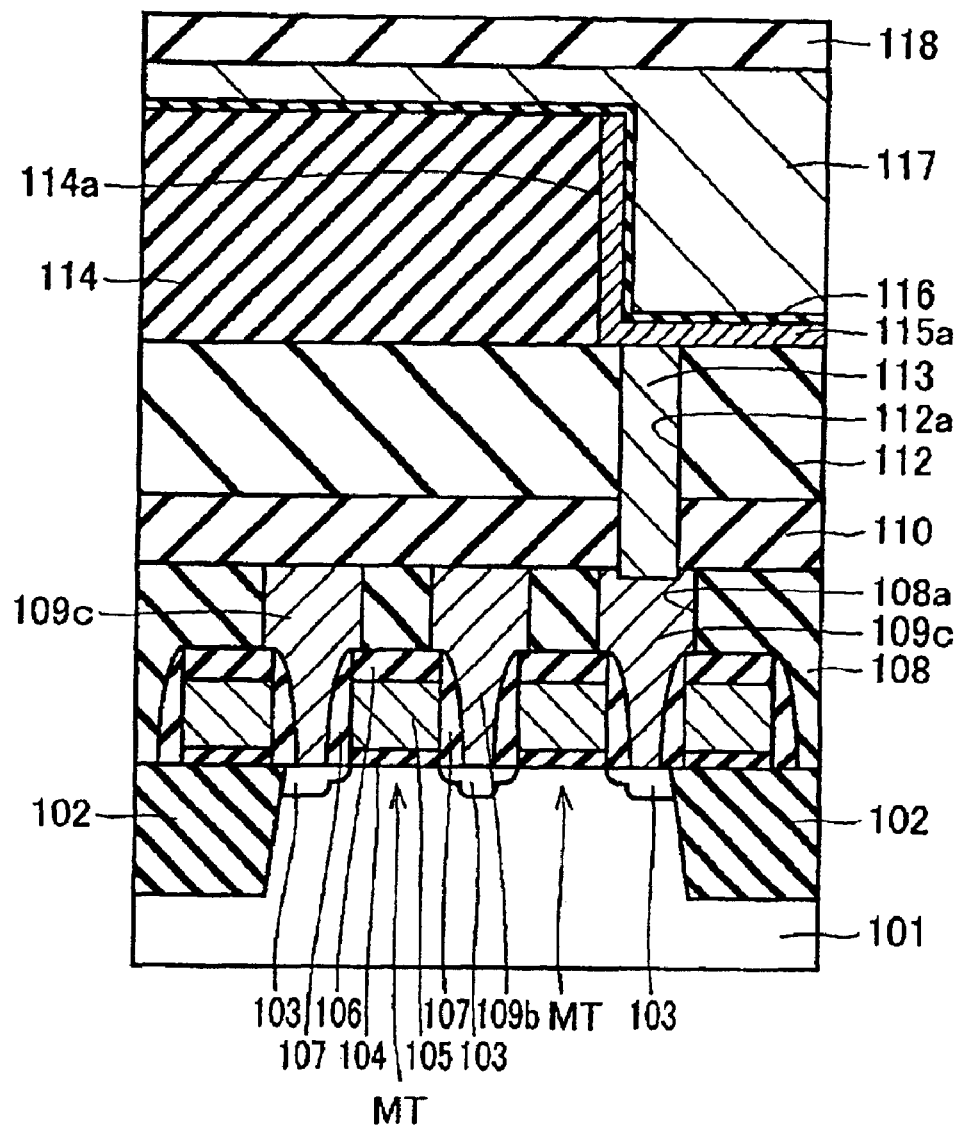
FIG. 50 is a schematic sectional view taken on line L—L of FIG. 48.
Figure 51:
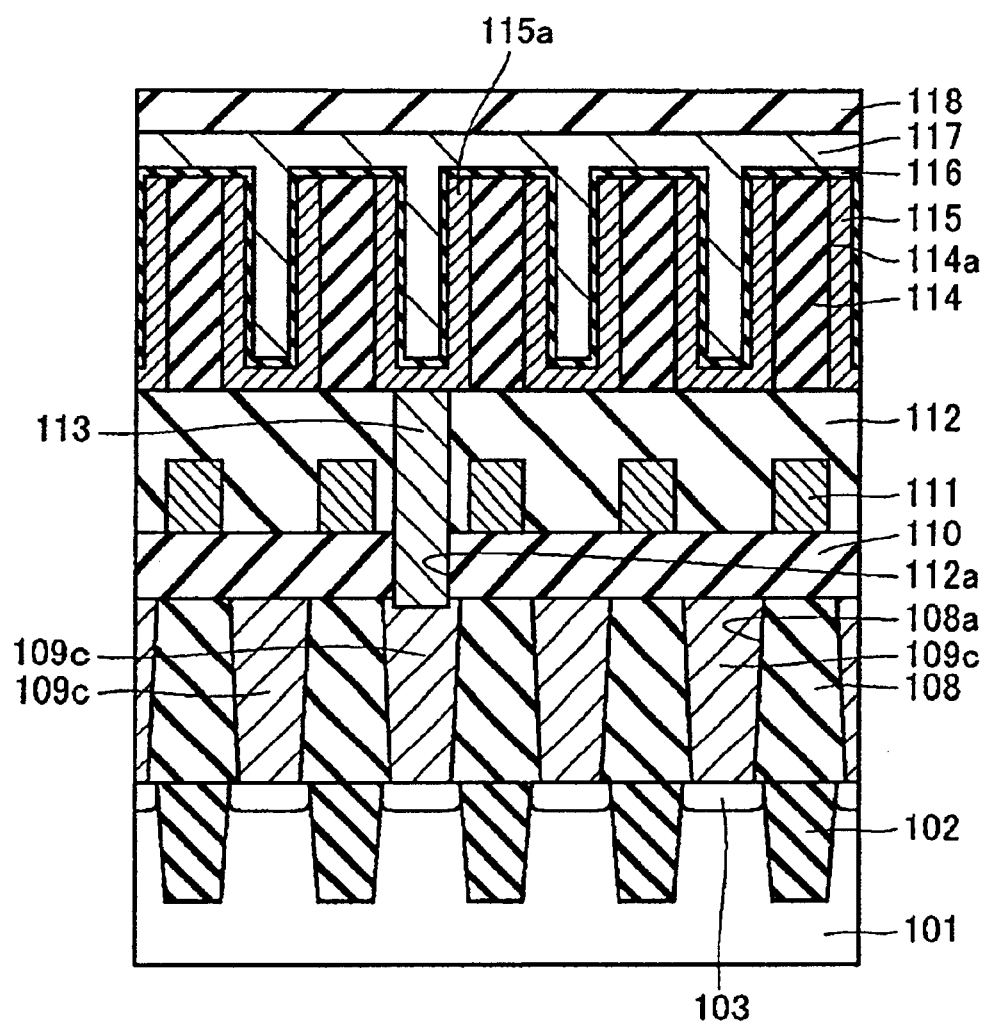
FIG. 51 is a schematic sectional view taken on line LI—LI of FIG. 48.
Figure 52:
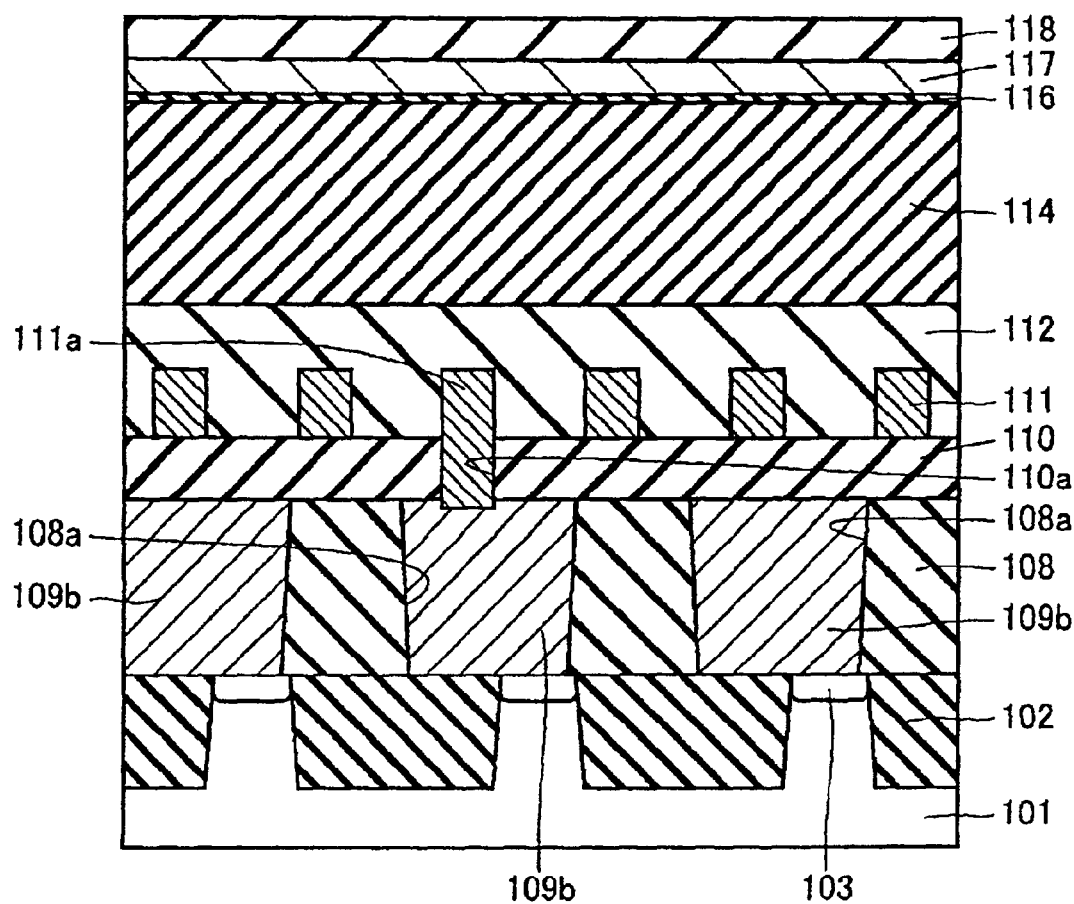
FIG. 52 is a schematic sectional view taken on line LII—LII of FIG. 48.

Referring to FIG. 47, the center of a feature of hole pattern 55 is shifted from the center of a corresponding feature of pattern 54*b* for coupled landing pad layer 9*a* downward to the right as viewed in front of the figure with the center line of pattern 54*b* positioned vertically. Furthermore, the center of a feature of hole pattern 56 is shifted with respect to the corresponding location for placement of FIG. 45 (, which is shown with a dotted line in FIG. 47) to upward to the left.

In such a way, features of hole patterns 55 and 56 are shifted toward opposite directions along which the features of hole patterns 55 and 56 become more spaced apart from each other. For this reason, a hole formed by hole pattern 55 and a hole formed by hole pattern 56 can be prevented from being coupled with each other by an optical proximity effect. There arises more of the preventive effect against coupling between the holes compared with the above fifteenth embodiment.

Note that necessity arise for a shift of a feature of hole pattern 55 with respect to a corresponding feature of pattern 54*b* for coupled landing pad layer 9*a* and a shift of a feature of hole pattern 56 with respect to a corresponding feature of pattern 51 for landing pad layer 9*b* to be adjusted such that holes 10*a* and 10*b* do not protrude out from the peripheries of respective landing pad layers 9*a* and 9*b.*

In the above first to sixteenth embodiments, description is given of the configuration in which the memory cell area and the monitor area are both formed in a system, the present invention can be applied to a configuration in which only the monitor area is formed in a system with no memory cell area.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having a monitor pattern for measuring a characteristic of a memory cell transistor included in a memory cell, comprising:

a monitor transistor having a source impurity region and a drain impurity region;

a first lead interconnection layer, electrically connected to said source impurity region and having a section to which a needle of a probe can be connected externally; and a second lead interconnection layer, electrically connected to said drain impurity region and having a section to which a needle of a probe can be connected externally, wherein said first and second lead interconnection layers are formed on the same layer and further, formed from the same layer as is either a bit line conductive layer or a storage node conductive layer, electrically connected to said memory cell transistor.

2. The semiconductor device according to claim 1, wherein a material of said first and second lead interconnection layers are made from metal.

3. The semiconductor device according to claim 1, wherein said first and second lead interconnection layers are formed on the same layer as is said storage node conductive layer.

4. The semiconductor device according to claim 1, wherein said first and second lead interconnection layers are electrically connected to said bit line conductive layer and said storage node conductive layer, respectively, through pad layers.

5. The semiconductor device according to claim 4, wherein said pad layers are connected to one of a source impurity region and drain impurity region of one of said monitor transistor and to one of a source impurity region and drain impurity region of another said monitor transistor, and one of said first and second lead interconnection layers is connected to an almost center portion of a top surface of a pad layer.

* * * * *